(12) United States Patent
Fritz et al.

(10) Patent No.: US 10,129,972 B2
(45) Date of Patent: Nov. 13, 2018

(54) FRAME ELEMENTS FOR PACKAGE STRUCTURES COMPRISING PRINTED CIRCUIT BOARDS (PCBS)

(71) Applicant: Avago Technologies General IP (Singapore) Pte. Ltd., Singapore (SG)

(72) Inventors: Martin Fritz, Munich (DE); Bernhard Gebauer, Tuntenhausen (DE); Lueder Elbrecht, Munich (DE); Martin Handtmann, Riemerling (DE); Oliver Wiedenmann, Munich (DE); Sergej Scherer, Munich (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 85 days.

(21) Appl. No.: 14/928,055

(22) Filed: Oct. 30, 2015

(65) Prior Publication Data
US 2017/0127523 A1     May 4, 2017

(51) Int. Cl.
| | | |
|---|---|---|
| *H05K 1/18* | (2006.01) | |
| *H05K 1/02* | (2006.01) | |
| *H05K 1/11* | (2006.01) | |
| *H01L 23/552* | (2006.01) | |
| *H05K 3/28* | (2006.01) | |

(52) U.S. Cl.
CPC ......... *H05K 1/0216* (2013.01); *H01L 23/552* (2013.01); *H05K 1/0298* (2013.01); *H01L 2224/16225* (2013.01); *H01L 2924/181* (2013.01); *H05K 1/181* (2013.01); *H05K 3/284* (2013.01); *H05K 999/99* (2013.01); *H05K 2201/2018* (2013.01); *H05K 2203/1316* (2013.01)

(58) Field of Classification Search
CPC .... H05K 1/185; H05K 1/0216; H05K 1/0298; H05K 1/115
USPC ........................................................ 361/761
See application file for complete search history.

(56) References Cited

U.S. PATENT DOCUMENTS

| | | | |
|---|---|---|---|
| 5,883,737 | A | 3/1999 | Fujikawa et al. |
| 6,748,650 | B2 | 6/2004 | Singh |
| 7,026,664 | B2 | 4/2006 | Divakar et al. |
| 8,314,472 | B2 | 11/2012 | Parkhurst et al. |
| 8,344,504 | B2 | 1/2013 | Wholey et al. |
| 8,378,495 | B2 | 2/2013 | West et al. |
| 8,502,081 | B2 | 8/2013 | Kanemaru et al. |
| 8,536,707 | B2 | 9/2013 | Wholey et al. |

(Continued)

FOREIGN PATENT DOCUMENTS

GB     2325082     11/1998

OTHER PUBLICATIONS

Office Action dated Jun. 29, 2017 in co-pending U.S. Appl. No. 14/799,534, 16 pages.

(Continued)

*Primary Examiner* — Eric Thomas
*Assistant Examiner* — Michael P McFadden

(57) ABSTRACT

An apparatus, includes a substrate, an electronic component disposed over the substrate, and a frame element disposed over the substrate. The frame element provides structural rigidity to the apparatus. The apparatus also includes an encapsulating material disposed over an upper surface of the substrate, the electronic component and the frame element. An electrically conductive layer is disposed over the encapsulating material.

29 Claims, 16 Drawing Sheets

(56) References Cited

U.S. PATENT DOCUMENTS

| | | |
|---|---|---|
| 8,575,758 B2 | 11/2013 | West et al. |
| 8,670,471 B2 | 3/2014 | Kim |
| 8,680,404 B2 | 3/2014 | Ryoichi et al. |
| 8,802,504 B1 | 8/2014 | Hou et al. |
| 8,946,904 B2 | 2/2015 | Railkar et al. |
| 9,299,649 B2 | 3/2016 | Chiu et al. |
| 9,608,749 B2 | 3/2017 | Mueller et al. |
| 9,997,428 B2 | 6/2018 | Maple et al. |
| 2010/0265671 A1 | 10/2010 | Tsai et al. |
| 2011/0313787 A1 | 12/2011 | Rangadass et al. |
| 2011/0316148 A1 | 12/2011 | Kondo |
| 2012/0146180 A1 | 6/2012 | Roy |
| 2013/0140265 A1 | 6/2013 | Kim |
| 2013/0187280 A1 | 7/2013 | Yuan |
| 2013/0248584 A1 | 9/2013 | Bi |
| 2015/0062835 A1* | 3/2015 | Kai ............... H01L 23/3121 361/748 |
| 2015/0217995 A1 | 8/2015 | Teh et al. |
| 2015/0228416 A1* | 8/2015 | Hurwitz ............ H01G 17/00 361/763 |
| 2015/0351229 A1 | 12/2015 | Lee et al. |
| 2016/0073496 A1* | 3/2016 | Vincent ............ H05K 1/0298 361/772 |
| 2017/0018501 A1 | 1/2017 | Maple et al. |

OTHER PUBLICATIONS

Co-pending U.S. Appl. No. 14/811,736, filed Jul. 28, 2015.
Co-pending U.S. Appl. No. 14/799,534, filed Jul. 14, 2015.
Office Action dated Feb. 19, 2016 in co-pending U.S. Appl. No. 14/929,309, 20 pages.
Office Action dated Aug. 24, 2016 in co-pending U.S. Appl. No. 14/929,309, 17 pages.
Restriction Requirement dated Mar. 30, 2016 in co-pending U.S. Appl. No. 14/799,534, 6 pages.
Office Action dated Sep. 6, 2016 in co-pending U.S. Appl. No. 14/799,534, 14 pages.
Notice of Allowance dated Mar. 22, 2017 in co-pending U.S. Appl. No. 14/799,534, 18 pages.
Final Office Action dated Jan. 9, 2018 in co-pending U.S. Appl. No. 14/799,534, 11 pages.
Notice of Allowance dated Feb. 22, 2018 in co-pending U.S. Appl. No. 14/799,534, 5 pages.
Supplemental Notice of Allowability dated Mar. 9, 2018 in co-pending U.S. Appl. No. 14/799,534, 2 pages.

* cited by examiner

FRAME ELEMENTS FOR PACKAGE STRUCTURES COMPRISING PRINTED CIRCUIT BOARDS (PCBS)

BACKGROUND

In many communications devices (e.g., mobile phones), there are electronic modules (e.g., radio-frequency (RF) modules) disposed over a multi-layer substrate. Each electronic module comprises one or more electronic component disposed over the substrate. As the trend towards smaller electrical devices continues, there is a need to reduce the size of many components that comprise the device. For example, there is a need to reduce the height of the electronic module. However, in order to maintain the package density, the number of substrate layers often cannot be reduced. So the height reduction is sometimes achieved by using thinner substrate layers. But thinner substrate layers can result in mechanical instability, including, but not limited to, warping of the substrate of the module, which can make die attach or wirebond-connections difficult to effect; or warping of the module with temperature changes over time. Such mechanical instabilities can impact the reliability of the module and ultimately, the reliability of the electrical device in which the module is disposed.

Further, in many applications, in order to reduce unwanted electromagnetic interactions between electronic modules, or to protect the components of the electronic module from electrical distortion, an electromagnetic shielding is required. The shielding may be achieved by providing a metallic cover that is soldered on the substrate to encapsulate electronic module. However, known metallic covers increase the overall height of the module because a space is created between the top of the electronic module and the metallic cover. As such, rather than decrease the height of the electronic module, this known shielding technique increases the package height, and can increase the area of the substrate as well.

What is needed, therefore, is an apparatus that overcomes at least the noted shortcomings of known apparatuses described above.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

Figure 1A:
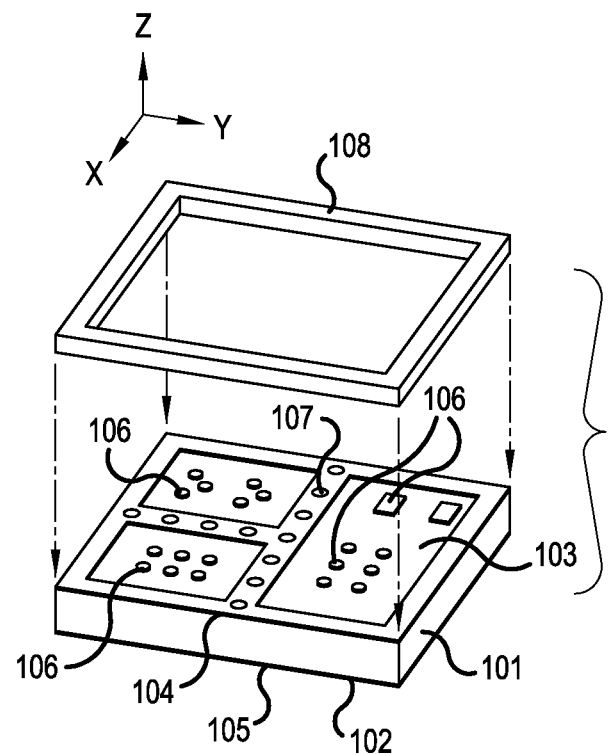
FIGS. 1A-1E show perspective views of a package structure in various stages of assembly in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the elements thereof in addition to the orientation depicted in the drawings. For example, if an apparatus (e.g., a semiconductor package) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

FIGS. 1A-1E show perspective views of a package structure 100 (see FIG. 1E) in various stages of assembly in accordance with a representative embodiment. Notably, the package structure 100 may be referred to as an apparatus. In accordance with representative embodiments, the package structure 100 may be a component/module of an electronic device (not shown), such as a mobile phone (not shown).

Referring to FIG. 1A, a substrate 101 has a lower surface 102 and an upper surface 103, which opposes the lower surface 102. As described more fully below, in a representative embodiment, the substrate 101 is a printed circuit board (PCB) and may comprise a plurality of layers (see FIG. 1F). The substrate 101 generally comprises vias (see FIG. 1F) and electrical traces (sometimes referred to as routing layers). The vias may be used to effect electrical connections between some or all of the plurality of layers that comprise the substrate 101, whereas the electrical traces (sometimes referred to as routing layers (not shown)) may be used to effect connections among different components, or to other package structures (not shown), or both. By way of example, the electrical traces may be used to connect one component to another component of the package structure 100, or from one component of the package structure 100 to a component of another package structure (not shown). The electrical traces can function as transmission lines, delay lines, or impedance transformers, or form inductors, or capacitors, or combinations thereof.

Upper metallization 104 is disposed over the upper surface 103, and lower metallization 105 is disposed over the lower surface 102. The upper metallization 104 is illustratively copper, or gold, or a multi-layer of copper and gold, although other materials, or material combinations within the purview of one of ordinary skill in the art are contemplated depending on the application or design parameters. The upper metallization 104 may include a variety of metallization patterns used to effect various electrical connections. Just by way of example, the upper metallization 104 may comprise contact pads 106, configured to provide electrical connections to electronic components (not shown in FIG. 1A). Similarly, the lower metallization 105 is typically patterned to enable various electrical connections, described herein in connection with various representative embodiments, and to provide module pins (not shown). The upper metallization 104 and lower metallization 105 each comprise a known electrically conductive material provided by a known technique, to a desired height (z-direction in the coordinate system shown).

Illustratively, the substrate 101 has a thickness (z-direction in the coordinate system shown) of approximately 30 μm to approximately several millimeters; and the upper metallization 104 has a thickness (z-direction in the coordinate system shown) in the range of approximately 1.0 μm to approximately 50 μm. One or more electrically conductive vias ("vias") 107 are disposed selectively beneath the upper metallization 104, and extend from the upper surface 103, through the substrate 101 to metallization (e.g., routing layers (not shown)) in intermediate layers (see FIG. 1F) of the substrate 101, or to the lower surface 102. The vias 107 generally provide electrical connections between the upper metallization 104 and at least a metallization (not shown) in intermediate layers, and/or the lower metallization 105. The lower metallization 105 may comprise a number of parts or portions, with these parts making electrical connections (e.g., signal, power and ground connections) as needed. In one representative embodiment, parts of the lower metallization 105 may be electrically connected to a reference ground, enabling a connection to ground by selectively providing vias 107 between the upper metallization 104 and the lower metallization 105.

Figure 1B:
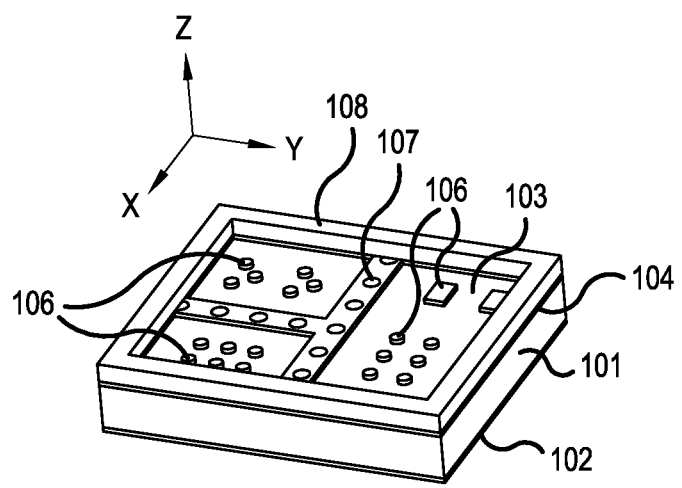

As depicted in FIG. 1A, frame element 108, which in the presently described representative embodiment, is previously fabricated, is lowered over the upper surface 103 of the substrate 101, and can make contact to the upper surface of the upper metallization 104. As should be appreciated by one of ordinary skill in the art, the frame element 108 provides structural rigidity not only after the package structure 100 is complete, but also during its fabrication and assembly. As such, once disposed over the upper surface of the substrate 101, the frame element 108 provides structural support during subsequent assembly and fabrication steps to realize the package structure 100 as depicted in FIG. 1E.

Generally, at least partial contact is made to the upper surface 103 of the substrate 101, and not completely to the upper surface of the upper metallization 104 to avoid possible delamination that can occur if contact is only made to the upper surface of the upper metallization 104. Referring to FIG. 1B, the frame element 108 is disposed over the upper surface 103. In a representative embodiment, the frame element 108 is disposed along a perimeter of the upper surface 103, and is affixed to the upper surface 103 using a suitable adhesive, including, but not limited to, known epoxy materials suitable for use in electronic applications, and known electrically conductive adhesive materials.

The frame element 108 may comprise a dielectric material (e.g., an organic or inorganic dielectric material), or an electrically conductive material (e.g., a metal or metal alloy). As described more fully herein, the frame element 108 provides, among other things, additional structural rigidity to the package structure 100 while not adding to the thickness (height) (z-direction in the depicted coordinate system of FIGS. 1A-1F). The material(s) selected for the frame element 108 generally do not have a greater shear modulus than other materials (e.g., material used for the layers of the substrate 101) of the package structure 100. However, materials having a greater shear modulus can be used. Moreover, in certain representative embodiments described below, the frame elements of certain embodiments comprise electrically conductive vias (not shown in FIGS. 1A-1F), which certainly add to the structural rigidity of the frame element and the package structure, again, while not adding to the height of the package structure.

By way of example, illustrative dielectric materials contemplated for the frame element 108 include, but are not limited to: glass-reinforced epoxy laminate materials (commonly referred to as "FR4"); hydrocarbon ceramic laminate materials (e.g., Rogers 4003, commercially available from Rogers Corporation, Rogers, Conn. USA); polytetrafluorethelyne (PTFE) composite laminates filled with random glass or ceramic (e.g., RT/Duroid, commerically available from Rogers Corporation); suitable polymer materials, suitable photopolymer materials, suitable epoxy materials, benzocyclobutene (BCB) (e.g., cyclotene, commercially available from Dow Chemical Company (USA)), Polymethyl methacrylate (PMMA), and similar resins useful in electronic and microelectronic applications.

Electrically conductive materials contemplated for use in the frame element 108 include, but are not limited to copper, aluminum and similar materials and alloys typically used in electronic and microelectronic applications.

It is emphasized that the various materials listed above are merely illustrative, and other materials suitable for use as the frame element 108 may be recognized by one of ordinary skill in the art to achieve its various functions described more fully below. These materials are also contemplated by the present teachings.

In the presently described representative embodiment, the frame element 108 is generally fabricated prior to being disposed over the upper surface 103, and by known methods. The glass-reinforced epoxy laminate materials, hydrocarbon ceramic laminate materials, aluminum, and copper may be machined by punching, drilling/milling, or etching, or laser cutting, or stencil printing and sintering techniques. The polymer materials, photopolymer materials, epoxy materials, BCBs, PMMA, and similar resins may be formed into the frame element 108 by photolithography, or photolithography and etching.

Figure 1C:
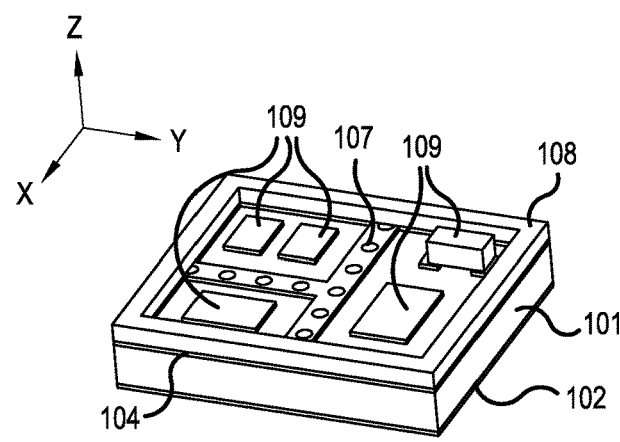

Referring to FIG. 1C, electronic components 109 are provided over the upper surface 103, and in electrical contact with upper metallization 104 (e.g., respective contact pads 106) in order to effect electrical connections between the various electronic components 109, between the electronic components 109 of the package structure 100, and between other components of the electronic device (not shown), in which the package structure 100 is disposed, and the electronic components 109 of the package structure 100.

The electronic components 109 are determined by the particular application of the package structure 100, and thus are generally not limited in scope by the present teachings. Generally, the electronic components 109 may be passive electrical components, or active electronic components, or both. Just by way of example, the package structure 100 may be a component of a communications device (e.g., mobile phone), and the package structure 100 may be a power amplifier duplexer module useful in the transmission and reception of signals to and from the communications device. In this case, the electronic components 109 may include active components (e.g., low noise amplifier, power amplifier, and switches), and passive components (e.g., bulk acoustic wave (BAW) filters, inductors, capacitor, resistors) within the purview of one of ordinary skill in the art. Moreover, the electronic components 109 may be, but are not necessarily, surface mount devices (SMDs).

The various electrical connections between the electronic components 109, and between the electronic components 109 and other components of the electronic device (not shown), may be made, for example, through electronic traces provided in the substrate 101, which as described below, may comprise a plurality of layers.

As depicted in FIG. 1C, the electronic components 109 each have a height (z-direction in the coordinate system depicted), which is not necessarily the same. In fact, one (or more) of the electronic components 109 has a first height that is a maximum electronic component height. Similarly, the frame element 108 has a second height (z-direction). In accordance with a representative embodiment, the second height that is not greater than the first height. In this way, the frame element does not add to/increase the overall thickness of the package structure 100. However, because the frame element 108 is adhered to the substrate 101, additional structural rigidity is realized without increasing the overall height of the substrate 101, and the package structure 100. To this end, and regardless of the shear modulus of the frame element 108, by adding the frame element 108, structural rigidity is added to the substrate 101. Among other advantages, this additional structural rigidity provided to the substrate 101, and thus the overall package structure 100 by the frame element 108, reduces the tendency of the substrate 101 to warp in general and over time as a result of changes in temperature. Accordingly, because of the additional structural support provided by the frame element 108, the overall thickness of the substrate 101 can be substantially the same as a known package structure without the frame element, while the mechanical stability of the substrate 101 can be improved; or the overall thickness of the substrate 101 can be reduced, and the mechanical stability of the substrate 101 can remain substantially unchanged compared to a known package structure that does not include the frame element.

Figure 1D:
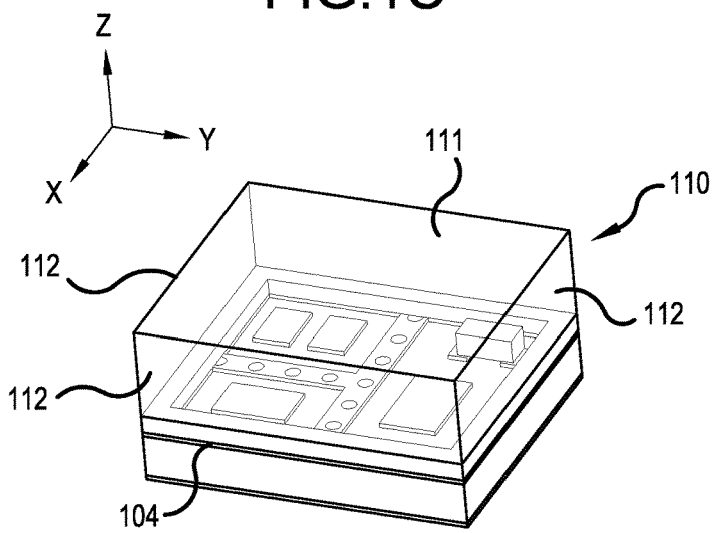
Figure 1E:
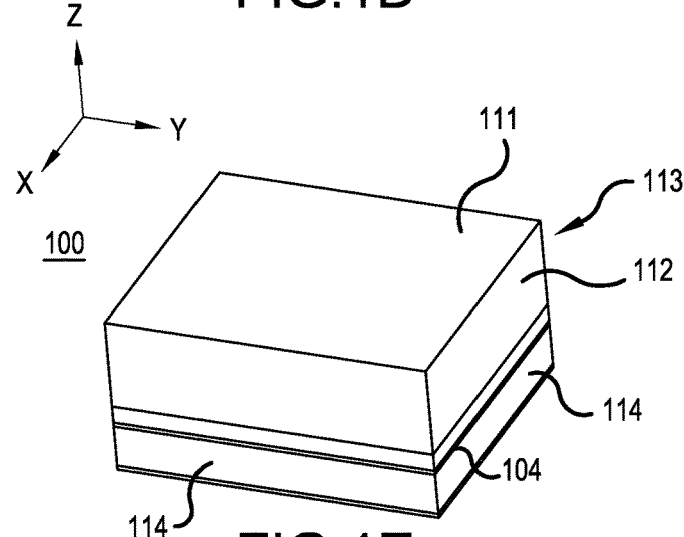

Referring to FIG. 1D, an encapsulating material 110 is disposed over the upper surface 103, the frame element 108, and the electronic components 109. The encapsulating material 110 comprises a top surface 111 and sides 112.

Generally, the encapsulating material 110 is a known electrically insulating material that beneficially provides protection to the various elements of the package structure 100 from contaminants.

In certain representative embodiments, the encapsulating material 110 is a so-called mold compound applied by a known method in a comparatively high pressure environment, as is known to one of ordinary skill in the art.

By way of example, the mold compound is a composite of $SiO_2$ and electronics-grade epoxy. The thickness (z-direction in the coordinate system shown) of the mold compound should be, at minimum, great enough to cover the electronic components 109, or illustratively approximately 10 μm to a few millimeters.

In other representative embodiments, the encapsulating material 110 is a so-called glob-top material that is illustratively applied as a fluid using a stencil print to ensure the fluid is provided only over desired locations (e.g., in compartments 315). The glob-top is then cured, such as by application of ultra-violet light, as is known to one of ordinary skill in the art. Illustratively, the glob-top material is a composite of electronics grade epoxy, silicone, and urethane. The thickness (z-direction in the coordinate system shown) of the glob-top should be, at minimum, great enough to cover the electronic components 109, or illustratively approximately 10 μm to a few millimeters.

As is known, the use of glob-top for the encapsulating material 110 can be beneficial compared to the use of mold compound. Among other benefits, application of glob-top does not require a comparatively high pressure environment, as is needed for mold compound application. Ultimately, sparing the various components of the package structure 100 from high pressure reduces the tendency for these components to become unattached or otherwise loosened or distorted. Moreover, the height (z-direction) of the encapsulating material 110 is more easily reduced compared to mold compounds, which must be grinded to a reduced height, as described more fully below.

Referring to FIG. 1E, a metal layer 113 is disposed over the encapsulating material 110 and substantially covers the top surface 111, and, optionally, sides 112, and sides 114 of the substrate 101. Notably, and as described more fully below, in certain representative embodiments, frame vias (not shown) usefully providing electromagnetic shielding, and obviates the need to provide metal layer 113 on sides 112, 114. In certain embodiments described below, the metal layer 113 can make electrical connection to a reference ground, thereby providing typically improved electromagnetic shielding to the package structure 100, and the components thereof. Alternatively, without such a connection to a reference ground, the metal layer 113 can provide electromagnetic shielding to the package structure 100, and the components thereof. In the latter case, electromagnetic shielding is provided by mirror currents that can be induced in the metal layer 113, and can suppress the externally penetrating or internal generated magnetic field. In the former case, the ground connection allows electromagnetic shielding to be extended more generally over the package structure 100, and enhanced. To this end, by providing the grounding, induced mirror currents are distributed more completely over the metal layer 113 to compensate comparatively more substantially than ungrounded structures.

Illustratively, the metal layer 113 may be sputter-deposited copper, or gold, or a multi-layer of copper and gold, although other materials, or material combinations within the purview of one of ordinary skill in the art are contemplated depending on the application or design parameters. The metal layer 113 has a thickness (z-direction in the coordinate system shown) of approximately 0.1 µm to approximately 50 µm. The metal layer 113 provides electromagnetic shielding of the package structure 100 and the electronic components 109 thereof. This electromagnetic shielding can be improved by ensuring electrical connection of the metal layer 113 to a reference ground.

Notably, the overall height (z-direction in the coordinate system shown) of the package structure 100 is in the range of approximately 0.1 mm to approximately several millimeters.

Figure 1F:
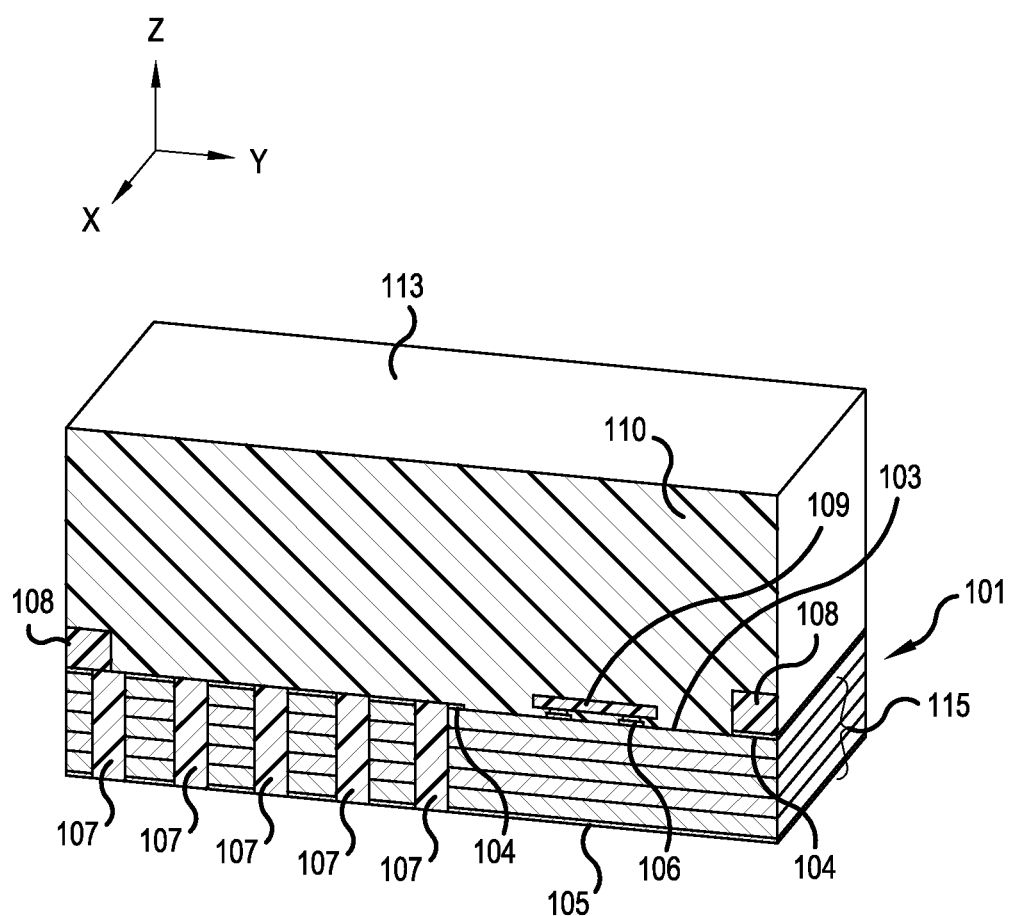
FIG. 1F shows a partial cross-sectional view of the package structure of FIG. 1E.

FIG. 1F shows a partial cross-sectional view of the package structure of FIG. 1E. As alluded to above, the substrate 101 comprises a plurality of layers 115, with the vias 107 extending through the plurality of layers 115 in this representative embodiment. Notably, the substrate 101 generally comprises electrical traces (not shown) configured to enable electrical connections between the various electronic components 109 of the package structure, and between other components of the electronic device (not shown), in which the package structure 100 is disposed. Electrical connections between the electrical traces and the electronic components 109, and/or between the electronic components 109 and other components of the electronic device (not shown), in which the package structure 100 is disposed may be effected using other vias (not shown). The plurality of layers 115 may comprise a dielectric material or a ceramic material. Illustrative materials include, but are not limited to prepreg, so-called build-up films, and polymers (including Teflon® and liquid crystal polymer (LCP)), aluminum oxide, ceramic, glass materials, or materials typically used in RF applications, such as Rogers 4003 as noted above. As is known, build-up films comprise resin-based epoxy films with fillers, such as silica and alumina, added.

Certain details of the materials and structures, and components, of the substrate 101 are described in one or more of the following commonly owned U.S. Pat. Nos. 8,946,904; 8,536,707; 8,344,504; and 8,314,472; and commonly owned U.S. patent application Ser. No. 14/811,736 filed on Jul. 28, 2015 to Thomas Dungan; and Ser. No. 14/799,534 to Marshall Maple, et al. filed on Jul. 14, 2015. The entire disclosures of U.S. Pat. Nos. 8,946,904; 8,536,707; 8,344,504; and 8,314,472; and U.S. patent application Ser. Nos. 14/811,736, and 14/799,534, are specifically incorporated herein by reference.

As noted above, the vias 107 effect an electrical connection between the lower metallization 105 and the upper metallization 104 of the package structure 100, as well as between intervening layers of the substrate 101, as noted above, and in some of the incorporated patents and patent applications. As can be appreciated, the lower metallization 105 may be connected to a reference ground. In certain representative embodiments, the frame element 108 can be made of an electrically conductive material. As depicted in FIG. 1F, one of the vias 107 makes contact with upper metallization 104 and the frame element 108, which in turn has the metal layer 113 disposed thereon. Accordingly, if the frame element 108 is an electrically conductive material, a connection to the reference ground by the lower metallization 105 to the metal layer 113 is realized. Beneficially, a connection to reference ground enables the metal layer 113 to provide improved electromagnetic shielding to the package structure 100, the electronic components 109, and electrical connections (e.g., upper metallization 104 including contact pads 106) thereof.

FIGS. 2A-2E show perspective views of a package structure 200 (see FIG. 2E) in various stages of assembly in accordance with a representative embodiment. Notably, the package structure 200 may be referred to as an apparatus, and shares many common aspects, features, benefits, and applications with the package structure 100. Many of these common aspects, features, benefits, and applications may not be repeated in order to avoid obscuring the presently described representative embodiments.

Figure 2A:
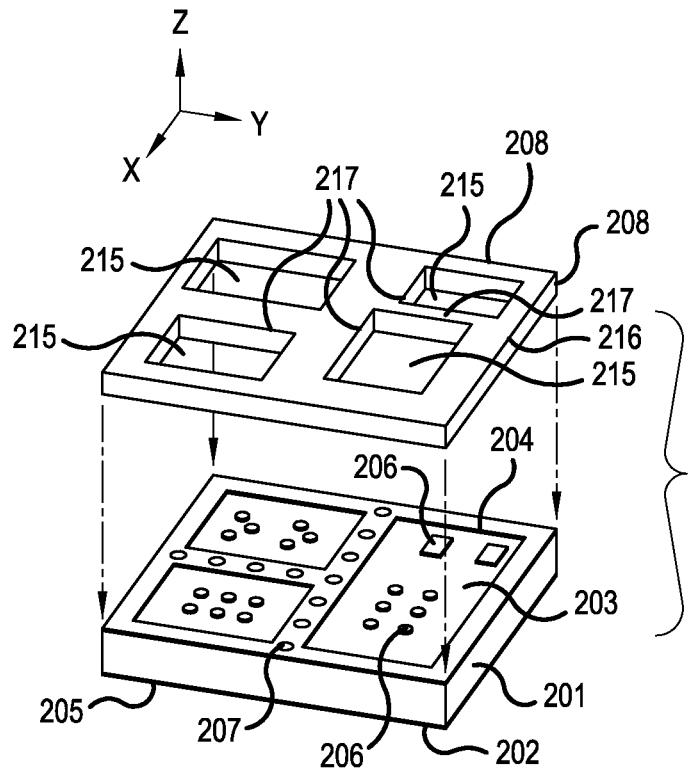
FIGS. 2A-2E show perspective views of a package structure in various stages of assembly in accordance with a representative embodiment.

Referring to FIG. 2A, a substrate 201 has a lower surface 202 and an upper surface 203, which opposes the lower surface 202. As described more fully below, in a representative embodiment, the substrate 201 is a printed circuit board (PCB) and may comprise a plurality of layers (see FIG. 2F). The substrate 201 generally comprises vias (see FIG. 2F) and electrical traces (sometimes referred to as routing layers). The vias may be used to effect electrical connections between at least some of the plurality of layers that comprise the substrate 201, whereas the electrical traces (sometimes referred to as routing layers (not shown)) may be used to effect connections among different components, or to other package structures (not shown), or both. By way of example, the electrical traces may be used to connect one component to another component of the package structure 200, or from one component of the package structure 200 to a component of another package structure (not shown). These electrical traces can function as transmission lines, delay lines or impedance transformers, or form inductors, or capacitors, or combinations thereof.

Upper metallization 204 is disposed over the upper surface 203, and lower metallization 205 is disposed over the lower surface 202. The upper metallization 204 is illustratively copper, or gold, or a multi-layer of copper and gold, although other materials within the purview of one of ordinary skill in the art are contemplated depending on the application or design parameters. The upper metallization 204 may include a variety of metallization patterns used to effect various electrical connections. Just by way of example, the upper metallization 204 may comprise contact pads 206, configured to provide electrical connections to electronic components (not shown in FIG. 2A). Similarly, the lower metallization 205 is typically patterned to enable various electrical connections, such as noted above in connection with representative embodiments, and to provide module pins (not shown). The upper metallization 204 and lower metallization 205 each comprise a known electrically conductive material provided by a known technique, to a desired height (z-direction in the coordinate system shown).

One or more electrically conductive substrate vias ("vias") 207 are disposed selectively beneath the upper metallization 204, and, as noted above in connection with representative embodiments, extend from the upper surface 203, through the substrate 201 to internally located metallization (e.g. routing layers (not shown)) of an intermediate layer (see FIG. 2F), or to the lower surface 202, or both. Like vias 107, vias 207 generally provide electrical connections between the upper metallization 204 and metallization (not shown) of intermediate layers, or lower metallization 205 (see FIG. 2F), or combinations thereof. In one representative embodiment, the lower metallization 205 is electrically connected to a reference ground, enabling a connection to ground by selectively providing vias 207 between the upper metallization 204 and the lower metallization 205.

As depicted in FIG. 2A, frame element 208, which, in the presently described representative embodiment, is previously fabricated, is lowered over the upper surface 203 of the substrate 201, and can make contact to the upper surface of the upper metallization 204. Like frame element 108, the frame element 208 provides structural rigidity not only after the package structure 200 is complete, but also during its fabrication and assembly. As such, once disposed over the upper surface of the substrate 201, the frame element 208 provides structural support during subsequent assembly and fabrication steps to realize the package structure 200 as depicted in FIG. 2E.

Generally, at least partial contact is made to the upper surface 203 of the substrate 201, and not completely to the upper surface of the upper metallization 204 to avoid possible delamination that can occur if contact is only made to the upper surface of the upper metallization 204. The frame element 208 comprises an outer wall 216 defining its perimeter, and a plurality of compartments 215 with respective interior walls 217 separating one compartment 215 from another. As described more fully below, additional structural rigidity is realized by the addition of the compartments 215 and interior walls 217 therebetween. Moreover, and as described more fully below, additional electromagnetic shield can be realized by the addition of the compartments 215 and interior walls 217 therebetween.

Figure 2B:
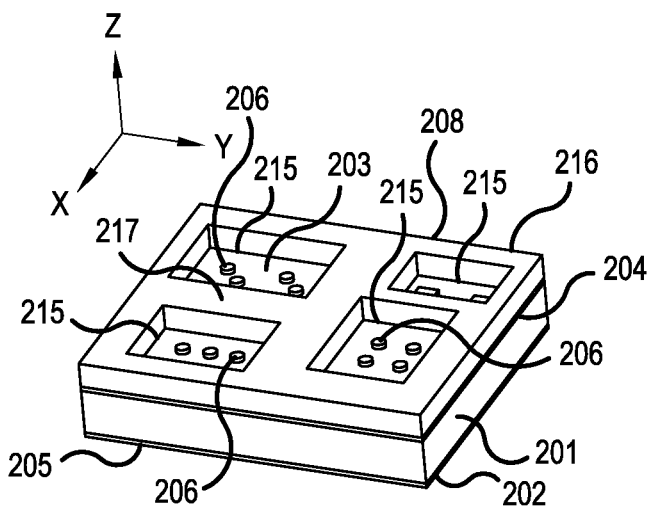

Referring to FIG. 2B, the frame element 208 is disposed over the upper surface 203, and can make contact to the upper surface of the upper metallization 204. Generally, at least partial contacts made to the upper surface 203 of the substrate 201, and not completely to the upper surface of the upper metallization 204 to avoid possible delamination that can occur if contact is only made to the upper surface of the upper metallization 204. In a representative embodiment, the frame element 208 is disposed along a perimeter of the upper surface 203, and the interior walls 217 are generally aligned with and disposed over the upper metallization 204. The frame element 208 is affixed to the upper surface 203 using a suitable adhesive, such as a known epoxy material suitable for use in electronic applications.

The frame element 208 may comprise a dielectric material (e.g., an organic or inorganic dielectric material), or an electrically conductive material (e.g., a metal or metal alloy).

Figure 2C:
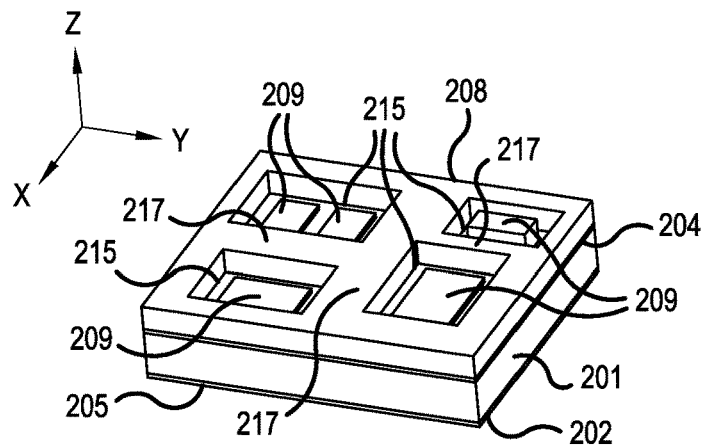

Referring to FIG. 2C, electronic components 209 are provided over the upper surface 203 in respective compartments 215 as shown. The electronic components are in electrical contact with upper metallization 204 (e.g., respective contact pads 206) in order to effect electrical connections between the various electronic components 209, between the electronic components 209 of the package structure 200, and between other components of the electronic device (not shown), in which the package structure 200 is disposed, and the electronic components 209 of the package structure 200.

The electronic components 209 are determined by the particular application of the package structure 200, and thus are generally not limited in scope by the present teachings. Generally, the electronic components 209 may be passive electrical components, or active electronic components, or both, such as those described above in connection with representative embodiments, and may be, but are not necessarily, surface mount devices (SMDs).

The various electrical connections between the electronic components 209, and between the electronic components 209 and other components of the electronic device (not shown), may be made, for example, through electronic traces provided in the substrate 201, which as described below, may comprise a plurality of layers.

As alluded to above, in certain representative embodiments electromagnetic shielding is provided by the interior walls 217 and between electronic components 209 in different compartments 215. More generally, interior walls 217, and other interior walls described in connection with certain representative embodiments below, provide electromagnetic shielding of other structures in various compartments. These other structures include, but are not limited to, passive electrical elements such as transmission lines, inductors, and capacitors. As will be appreciated, the number and size of the compartments 215 may be dictated by the need to place electronic components in different compartments in order to provide this desired electromagnetic shielding.

In accordance with a representative embodiment, electromagnetic shielding between electronic components 209 disposed in different compartments 215 may be effected by fabricating the frame element 208 from an electrically conductive material (e.g., metal). Vias 207, such as those in contact with upper metallization 204 disposed beneath interior walls 217 as shown, for example in FIGS. 2B-2C, are in contact with lower metallization 205, which is in contact with reference ground. The interior walls 217 in contact with upper metallization 204 are therefore electrically connected to reference ground, and thereby present reference ground voltage. As described more fully below, this results in typically improved electromagnetic shielding between the compartments 215, and the respective electronic components 209 thereof. If the frame element 208 comprises an electrically conductive material, but is not in contact with a reference voltage, electromagnetic shielding may be realized. As depicted in FIG. 2C, the electronic components 209 each have a height (z-direction in the coordinate system depicted), which is not necessarily the same. In fact, one (or more) of the electronic components 209 has a first height that is a maximum electronic component height. Similarly, the outer wall 216 and the interior walls 217 between the compartments 215 have a second height (z-direction), which is the same. In accordance with a representative embodiment, the second height that is not greater than the first height. In this way, the frame element 208 does not add to/increase the overall thickness of the package structure 200. However, because the frame element 208 is adhered to the substrate 201, additional structural rigidity during and after the assembly sequence of the package structure 200 is realized without increasing the overall height of the substrate 201, and the package structure 200. Furthermore, the addition of compartments 215, and the interior walls 217 therebetween, provides somewhat of a lattice arrangement, and, thereby, provides additional structural rigidity to the frame element 208 compared to frame element 108. As such, and regardless of the shear modulus of the frame element 208, by adding the frame element 208 comprising compartments 215 and interior walls 217, structural rigidity is added to the substrate 201. Among other advantages, this additional structural rigidity provided to the substrate 201, and thus the overall package structure 200 by the frame element 208 comprising compartments 215 and interior walls 217, reduces the tendency of the substrate 201 to warp in general and over time as a result of changes in temperature. Accordingly, because of the additional structural support provided by the frame element 208, the overall thickness of the substrate 201 can be substantially the same as a known package structure without the frame element, while the mechanical stability of the substrate 201 can be improved; or the overall thickness of the substrate 201 can be reduced, and the mechanical stability of the substrate 201 can remain substantially unchanged compared to a known package structure that does not include the frame element.

Figure 2D:
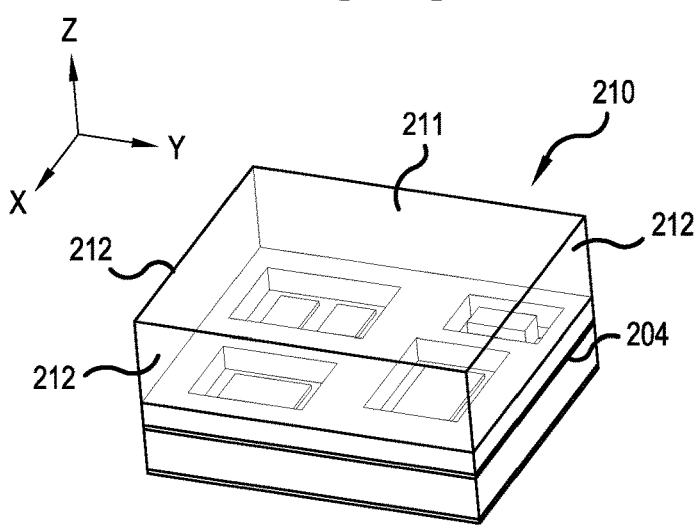
Figure 2E:
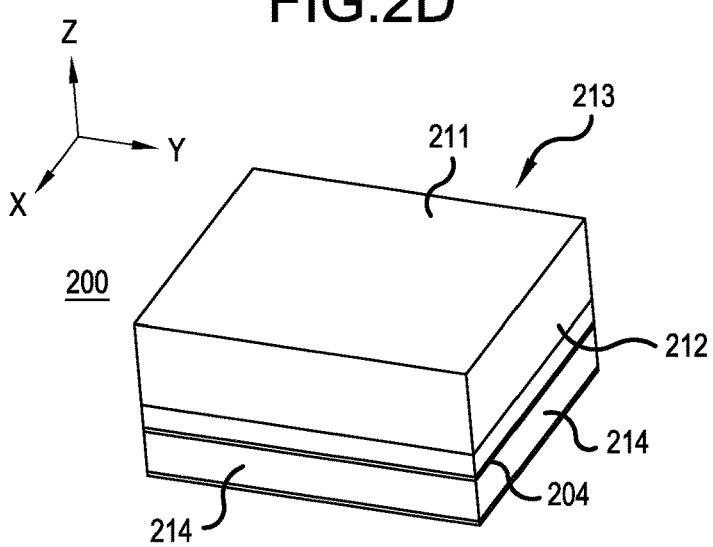

Referring to FIG. 2D, an encapsulating material 210 is disposed over the upper surface 203, the frame element 208, and the electronic components 209. The encapsulating material 210 comprises a top surface 211 and sides 212. Generally, the encapsulating material 210 is a known electrically insulating material. In certain representative embodiments, the encapsulating material 210 is a so-called mold compound applied by a known method in a comparatively high pressure environment, as is known to one of ordinary skill in the art. In other representative embodiments, the encapsulating material 210 is a so-called glob-top material that is illustratively applied as a fluid using a stencil print to ensure the fluid is provided only over desired locations (e.g., in compartments 215). The glob-top is then cured, such as by application of ultra-violet light, as is known to one of ordinary skill in the art.

Referring to FIG. 2E, a metal layer 213 is disposed over the encapsulating material 210 and substantially covers the top surface 211, and as noted above in connection with representative embodiments, optionally the sides 212, and sides 214 of the substrate 201. Specifically, like the metal layer 113 of representative embodiments described in connections with FIGS. 1A-1F, the metal layer 213 can make electrical connection to a reference ground, thereby providing typically improved electromagnetic shielding to the package structure 200, and the components thereof, by allowing mirror currents to extend to the ground plane on the lower surface 202, or the underlying motherboard. As such, the connection to the reference ground enhances electromagnetic shielding by allowing these mirror currents to flow to the ground plane or underlying motherboard. Alternatively, without such a connection to a reference ground, the metal layer 213 can provide electromagnetic shielding to the package structure 200, and the components thereof, through induced, albeit less extensive, mirror currents, as noted above in the description of representative embodiments of FIGS. 1A-1F.

Illustratively, the metal layer 213 may be sputter-deposited copper, or gold, or a multi-layer of copper and gold, although other materials, or material combinations within the purview of one of ordinary skill in the art are contemplated depending on the application or design parameters. The metal layer 213 provides of electromagnetic shielding of the package structure 200 and the electronic components 209 thereof. As described more fully below, this electromagnetic shielding can be improved by ensuring electrical connection of the metal layer 213 to a reference ground.

Figure 2F:
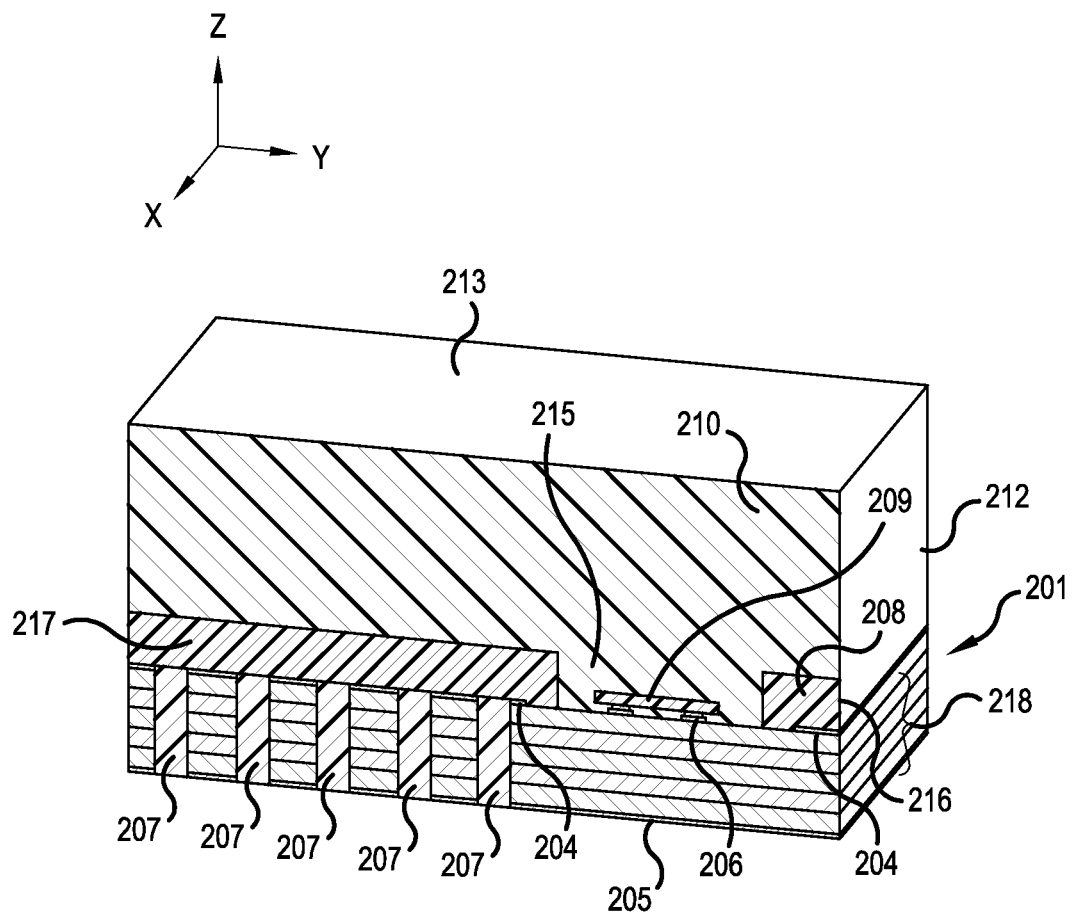
FIG. 2F shows a partial cross-sectional view of the package structure of FIG. 2E.

FIG. 2F shows a partial cross-sectional view of the package structure 200 of FIG. 2E. As alluded to above in connection with representative embodiments, the substrate 201 comprises a plurality of layers 218, with the some vias 207 extending through the plurality of layers 218 in this representative embodiment. Notably, the substrate 201 generally comprises electrical traces (not shown) configured to enable electrical connections between the various electronic components 209 of the package structure, and between other components of the electronic device (not shown), in which the package structure 200 is disposed. Electrical connections between the electrical traces and the electronic components 209, and/or between the electronic components 209 and other components of the electronic device (not shown), in which the package structure 200 is disposed may be effected using other vias (not shown).

As depicted in FIG. 2F, electronic component 209 is disposed in compartment 215, which is separated by interior wall 217 from another compartment (not shown in FIG. 2F). Moreover, as noted above in connection with representative embodiments, some vias 207 extend between the upper metallization 204 over which interior wall 217 is disposed, and lower metallization 205. As described above in connection with representative embodiments, if the interior wall is made of an electrically conductive material, and a portion of the lower metallization is connected to reference ground, the interior wall provides typically improved electromagnetic shielding.

FIGS. 3A-3E show perspective views of a package structure 300 (see FIG. 3E) in various stages of assembly in accordance with a representative embodiment. Notably, the package structure 300 may be referred to as an apparatus, and shares many common aspects, features, benefits, and applications with the package structures 100, 200 described above. Many of these common aspects, features, benefits, and applications may not be repeated in order to avoid obscuring the presently described representative embodiments.

Figure 3A:
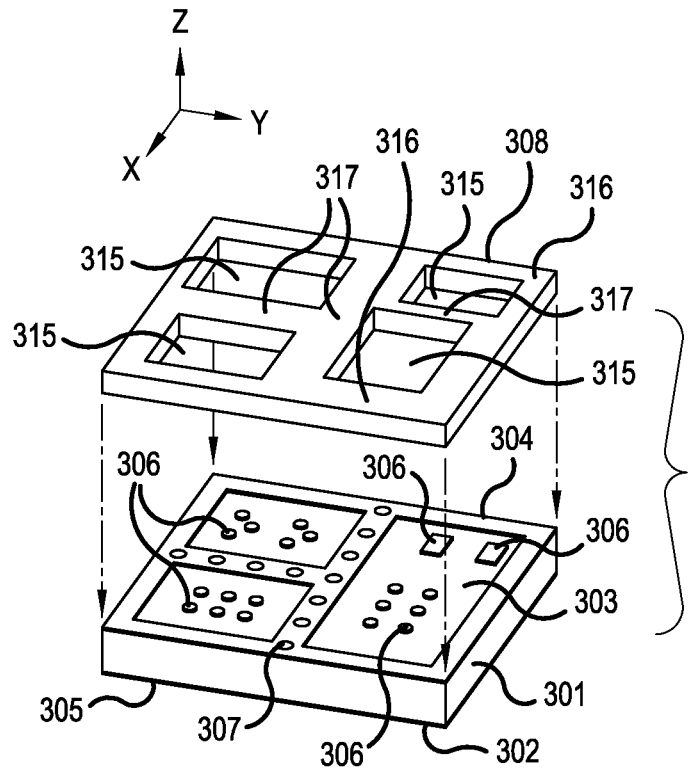
FIGS. 3A-3E show perspective views of a package structure in various stages of assembly in accordance with a representative embodiment.

Referring to FIG. 3A, a substrate 301 has a lower surface 302 and an upper surface 303, which opposes the lower surface 302. As described more fully below, in a representative embodiment, the substrate 301 is a printed circuit board (PCB) and may comprise a plurality of layers (see FIG. 3F) with or without metallization (not shown). The substrate 301 generally comprises vias (see FIG. 3F) and electrical traces (sometimes referred to as routing layers). The vias may be used to effect electrical connections between some or all of the plurality of layers that comprise the substrate 301, whereas the electrical traces (sometimes referred to as routing layers (not shown)) may be used to effect connections among different components, or to other package structures (not shown), or both. By way of example, the electrical traces may be used to connect one component to another component of the package structure 300, or from one component of the package structure 300 to a component of another package structure (not shown). The electrical traces can function as transmission lines, delay lines, or impedance transformers, or form inductors, or capacitors, or combinations thereof.

Upper metallization 304 is disposed over the upper surface 303, and lower metallization 305 is disposed over the lower surface 302. The upper metallization 304 is illustratively copper, or gold, or a multi-layer of copper and gold, although other materials, or material combinations within the purview of one of ordinary skill in the art are contemplated depending on the application or design parameters. The upper metallization 304 may include a variety of metallization patterns used to effect various electrical connections. Just by way of example, the upper metallization 304 may comprise contact pads 306, configured to provide electrical connections to electronic components (not shown in FIG. 3A). Similarly, the lower metallization 305 is typically patterned to enable various electrical connections, such as noted above in connection with representative embodiments, and to provide module pins (not shown). The upper metallization 304 and lower metallization 305 each comprise a known electrically conductive material provided by a known technique, to a desired height (z-direction in the coordinate system shown). One or more electrically conductive substrate vias 307 (hereinafter substrate vias 307)

are disposed selectively beneath the upper metallization 304, and extend from the upper surface 303, through the substrate 301 to metallization (e.g., routing layers—not shown) in intermediate layers (see FIG. 3F) of the substrate 301, or to the lower surface 302. The substrate vias 307 generally provide electrical connections between the upper metallization 304 and at least metallization (not shown) in intermediate layers, and/or the lower metallization 305. The lower metallization 305 may comprise a number of parts or portions, with these parts making electrical connections (e.g., signal, power and ground connections) as needed. In one representative embodiment, parts of the lower metallization 305 may be electrically connected to a reference ground, enabling a connection to ground by selectively providing substrate vias 307 between the upper metallization 304 and the lower metallization 305.

As depicted in FIG. 3A, frame element 308, which, in the presently described representative embodiment is previously fabricated, is lowered over the upper surface 303 of the substrate 301, and can make contact to the upper surface of the upper metallization 304. Like frame elements 108 and 208, the frame element 308 provides structural rigidity not only after the package structure 300 is complete, but also during its fabrication and assembly. As such, once disposed over the upper surface of the substrate 301, the frame element 308 provides structural support during subsequent assembly and fabrication steps to realize the package structure 300 as depicted in FIG. 3E.

The frame element 308 comprises an outer wall 316 defining its perimeter, and a plurality of compartments 315 with respective interior walls 317 separating one compartment 315 from another. As described more fully below, additional structural rigidity is realized by the addition of the compartments 315 and interior walls 317 therebetween. Moreover, and as described more fully below, additional electromagnetic shield can be realized by the addition of the compartments 315 and interior walls 317 therebetween. Notably, however, in the representative embodiments described in connection with FIGS. 3A-3F, the frame element 308 comprising compartments 315 is not essential. Rather, a frame that does not comprise compartments (e.g., frame element 108 described above) may be used. Beneficially, as described below, an overall reduction in height (z-direction in the coordinate system of FIGS. 3A-3F) is realized using either a frame element with compartments (e.g., frame element 308) or a frame element without compartments (e.g., frame element 108).

Figure 3B:
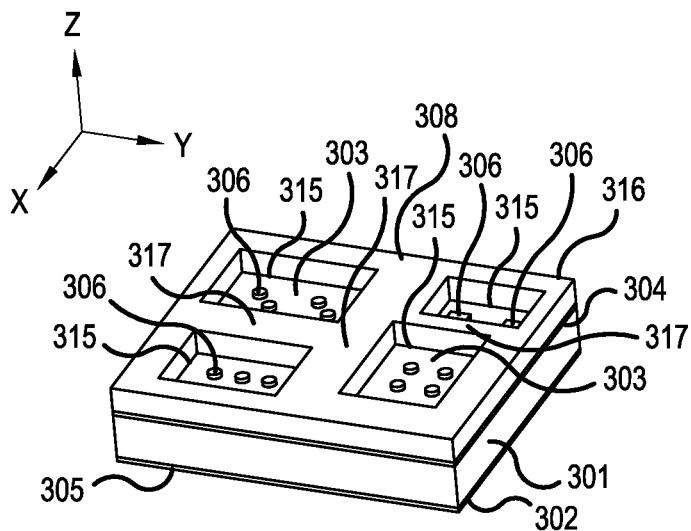

Referring to FIG. 3B, as noted above in connection with representative embodiments, the frame element 308 is disposed over the upper surface 303, and can make contact to the upper surface of the upper metallization 304. Generally, at least partial contact is made to the upper surface 303 of the substrate 301, and not completely to the upper surface of the upper metallization 304 to avoid possible delamination that can occur if contact is only made to the upper surface of the upper metallization 304. In a representative embodiment, the frame element 308 is disposed along a perimeter of the upper surface 303, and the interior walls 317 are generally aligned with and disposed over the upper metallization 304. The frame element 308 is affixed to the upper surface 303 using a suitable adhesive, such as a known epoxy material suitable for use in electronic applications.

The frame element 308 may comprise a dielectric material (e.g., an organic or inorganic dielectric material), or an electrically conductive material (e.g., a metal or metal alloy).

Figure 3C:
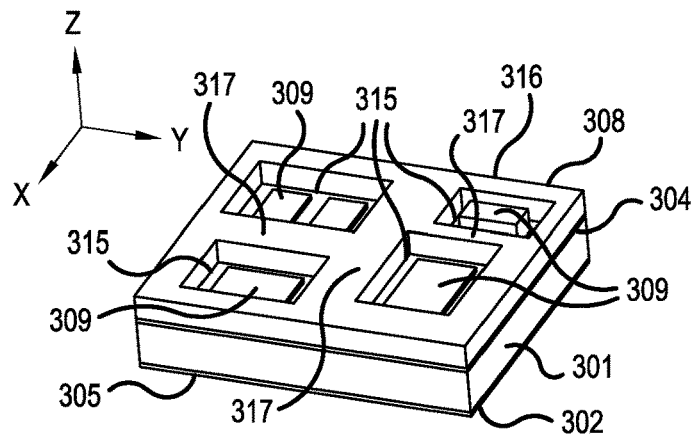

Referring to FIG. 3C, electronic components 309 are provided over the upper surface 303 in respective compartments 315 as shown. The electronic components are in electrical contact with upper metallization 304 (e.g., respective contact pads 306) in order to effect electrical connections between the various electronic components 309, between the electronic components 309 of the package structure 300, and between other components of the electronic device (not shown), in which the package structure 300 is disposed, and the electronic components 309 of the package structure 300.

The electronic components 309 are determined by the particular application of the package structure 300, and thus are generally not limited in scope by the present teachings. Generally, the electronic components 309 may be passive electrical components, or active electronic components, or both, such as those described above in connection with representative embodiments, and may be, but are not necessarily, surface mount devices (SMDs).

The various electrical connections between the electronic components 309, and between the electronic components 309 and other components of the electronic device (not shown), may be made, for example, through electronic traces provided in the substrate 301, which as described below, may comprise a plurality of layers.

As alluded to above, in certain representative embodiments electromagnetic shielding is provided by the interior walls 317 and between electronic components 309 in different compartments 315. As will be appreciated, the number and size of the compartments 315 may be dictated by the need to place electronic components in different compartments in order to provide this desired electromagnetic shielding.

In accordance with a representative embodiment, electromagnetic shielding between electronic components 309 disposed in different compartments 315 may be effected by fabricating the frame element 308 from an electrically conductive material (e.g., metal). Substrate vias 307, such as those in contact with upper metallization 304 disposed beneath interior walls 317 as shown, for example in FIGS. 3B-3C, are in contact with lower metallization 305, which is in contact with reference ground. The interior walls 317 in contact with upper metallization 304 are therefore electrically connected to reference ground, and present reference ground voltage. This results in typically improved electromagnetic shielding between the compartments 315, and the respective electronic components 309 thereof. If the frame element 308 comprises an electrically conductive material, but is not in contact with a reference voltage, electromagnetic shielding may be realized.

As depicted in FIG. 3C, the electronic components 309 each have a height (z-direction in the coordinate system depicted), which is not necessarily the same. In fact, one (or more) of the electronic components 309 has a first height that is a maximum electronic component height. Similarly, the outer wall 316 and the interior walls 317 between the compartments 315 have a second height (z-direction), which is substantially the same. In accordance with a representative embodiment, the second height is greater than the first height. As described more fully below, the frame element 308 functions as a stop during a sequence used to remove encapsulation material (see FIG. 3D). By removing some of the encapsulation material, further reduction in the thickness (z-direction) of the package structure 300 is realized compared to certain package structures of representative embodiments of FIGS. 1A-2F.

However, because the frame element 308 is adhered to the substrate 301, additional structural rigidity is realized without increasing the overall height of the substrate 301, and the package structure 300. Furthermore, the addition of compartments 315, and the interior walls 317 therebetween, provides somewhat of a lattice arrangement, and, thereby, provides additional structural rigidity to the frame element 308 compared to frame element 108. As such, and regardless of the shear modulus of the frame element 308, by adding the frame element 308 comprising compartments 315 and interior walls 317, structural rigidity is added to the substrate 301. Among other advantages, this additional structural rigidity provided to the substrate 301, and thus the overall package structure 300 by the frame element 308 comprising compartments 315 and interior walls 317, reduces the tendency of the substrate 301 to warp in general, and over time as a result of changes in temperature. Accordingly, because of the additional structural support provided by the frame element 308, the overall thickness of the substrate 301 can be substantially the same as a known package structure without the frame element, while the mechanical stability of the substrate 301 can be improved; or the overall thickness of the substrate 301 can be reduced, and the mechanical stability of the substrate 301 can remain substantially unchanged compared to a known package structure that does not include the frame element.

Figure 3D:
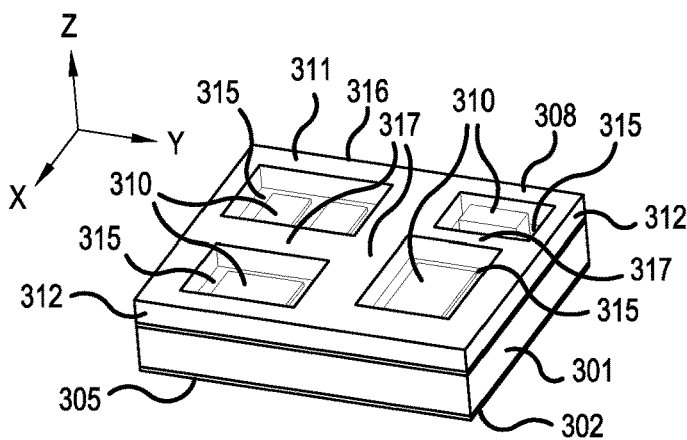
Figure 3E:
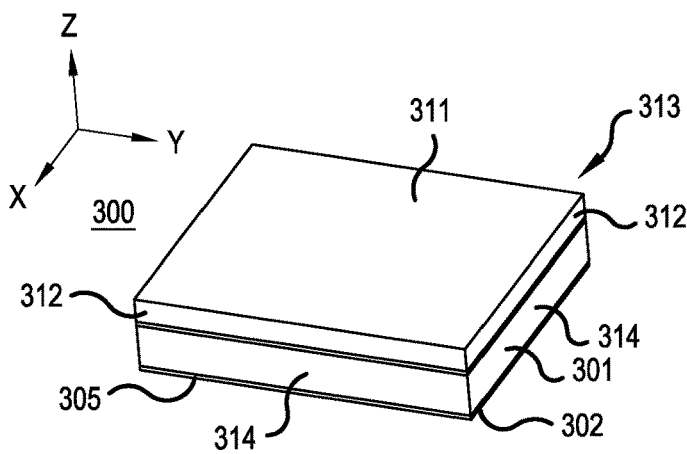

Referring to FIG. 3D, an encapsulating material 310 is disposed over the upper surface 303, the frame element 308, and the electronic components 309. The encapsulating material 310 comprises a top surface 311 and sides 312. Generally, the encapsulating material 310 is a known electrically insulating material. In certain representative embodiments, the encapsulating material 310 is a so-called mold compound applied by a known method in a comparatively high pressure environment, as is known to one of ordinary skill in the art. In other representative embodiments, the encapsulating material 310 is a so-called glob-top material that is illustratively applied as a fluid using a stencil print to ensure the fluid is provided only over desired locations (e.g., in compartments 315). The glob-top is then cured, such as by application of ultra-violet light, as is known to one of ordinary skill in the art.

After application of the encapsulating material 310, a sequence to reduce its thickness (z-direction) is effected, with the sequence being dictated by the material used for the encapsulating material 310. For example, if a mold compound is used for the encapsulating material 310, a known back-grinding method may be used to remove the encapsulating material 310. Beneficially, the frame element 308 functions as a grind-stop. Because the frame element 308 has a height that is greater than the electronic component 309 with the greatest height, and the grinding of the encapsulating material 310 terminates at the top of the frame element 308, no damage can occur to the electronic components 309.

Alternatively, if glob-top is used for the encapsulating material, the height (z-direction) of the frame element 308 is sufficient so that the glob-top to be applied in the compartments 315 in a sufficient thickness to cover electronic components 309, whereby the thickness of the glob-top is substantially equal to thickness of the frame element 308 so that a substantially planar surface results.

As can be appreciated, compared to certain other embodiments, the overall thickness/height (z-direction) of the package structure 300 is reduced by a reduction in thickness of the encapsulating material 310. By way of example, the overall height (z-direction in the coordinate system shown) of the package structure 300 is in the range of approximately 0.1 mm to approximately several millimeters.

By reducing the overall thickness (z-direction) of the encapsulating material 310 to be substantially the same as the height (z-direction) of the frame element 308, the overall height of the package structure 300 is substantially reduced. This reduction in overall thickness in the encapsulating material 310 provides latitude in designing the package structure 300. For example, the substrate 301 may comprise more layers, or thicker layers, or both, while maintaining the overall height of the package structure 300 the same or less than known package structures, and even package structures of certain representative embodiments discussed above, for example. The reduction in the thickness of the encapsulating material 310 also fosters a higher package density by allowing additional substrate layers to be included while maintaining the overall height of the package structure 300 compared to a structure that does not enjoy a reduction in the thickness of the encapsulating material thereof.

Referring to FIG. 3E, a metal layer 313 is disposed over the encapsulating material 310 and substantially covers the top surface 311, and optionally the sides 312, and sides 314 of the substrate 301. Specifically, like the metal layer 113 of representative embodiments described in connections with FIGS. 1A-1F, the metal layer 313 can make electrical connection to a reference ground, thereby providing typically improved electromagnetic shielding to the package structure 300, and the components thereof, by allowing mirror currents to extend to the ground plane on the lower surface 302, or the underlying motherboard. As such, the connection to the reference ground enhances electromagnetic shielding by allowing these mirror currents to flow to the ground plane or underlying motherboard. Alternatively, without such a connection to a reference ground, the metal layer 313 can provide electromagnetic shielding to the package structure 300, and the components thereof, through induced, albeit less extensive, mirror currents, as noted above in the description of representative embodiments of FIGS. 1A-1F.

Illustratively, the metal layer 313 may be sputter-deposited copper, or gold, or a multi-layer of copper and gold, although other materials, or material combinations within the purview of one of ordinary skill in the art are contemplated depending on the application or design parameters. The metal layer 313 provides of electromagnetic shielding of the package structure 300 and the electronic components 309 thereof. As described more fully above, this electromagnetic shielding can be improved by ensuring electrical connection of the metal layer 313 to a reference ground.

Figure 3F:
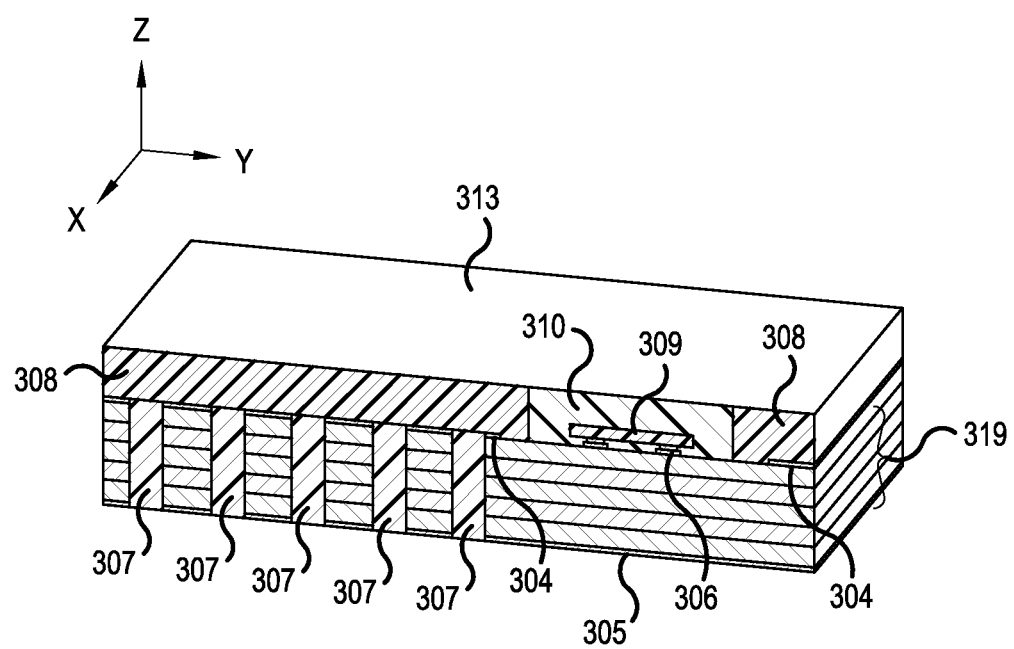
FIG. 3F shows a partial cross-sectional view of the package structure of FIG. 3E.

FIG. 3F shows a partial cross-sectional view of the package structure 300 of FIG. 3E. As alluded to above, the substrate 301 comprises a plurality of layers 318, with the some substrate vias 307 extending through the plurality of layers 318 in this representative embodiment. Notably, the substrate 301 generally comprises electrical traces (not shown) configured to enable electrical connections between the various electronic components 309 of the package structure, and between other components of the electronic device (not shown), in which the package structure 300 is disposed. Electrical connections between the electrical traces and the electronic components 309, and/or between the electronic components 309 and other components of the electronic device (not shown), in which the package structure 300 is disposed may be effected using other vias (not shown).

As depicted in FIG. 3F, electronic component 309 is disposed in compartment 315, which is separated by one or more interior walls 317 from another compartment (not shown in FIG. 3F). Moreover, some substrate vias 307 extend between the upper metallization 304 over which interior walls 317 are disposed, and lower metallization 305, whereas, as noted above in connection with representative embodiments, other substrate vias 307 provided connections between intermediate layers 318 of the substrate 101. As described above in connection with representative embodiments, if the interior wall is made of an electrically conductive material, and the lower metallization is connected to reference ground, the interior walls 317 provide electromagnetic shielding.

Moreover, the height (z-direction) of the encapsulating material 310 is substantially the same as the height of the frame element 308, which serves as a stop to prevent removal of the encapsulating material 310 beyond its height as described above in connection with representative embodiments.

FIGS. 4A-4E show perspective views of a package structure 400 (see FIG. 4E) in various stages of assembly in accordance with a representative embodiment. Notably, the package structure 400 may be referred to as an apparatus, and shares many common aspects, features, benefits, and applications with the package structures 100, 200, 300 described above. Many of these common aspects, features, benefits, and applications may not be repeated in order to avoid obscuring the presently described representative embodiments.

Figure 4A:
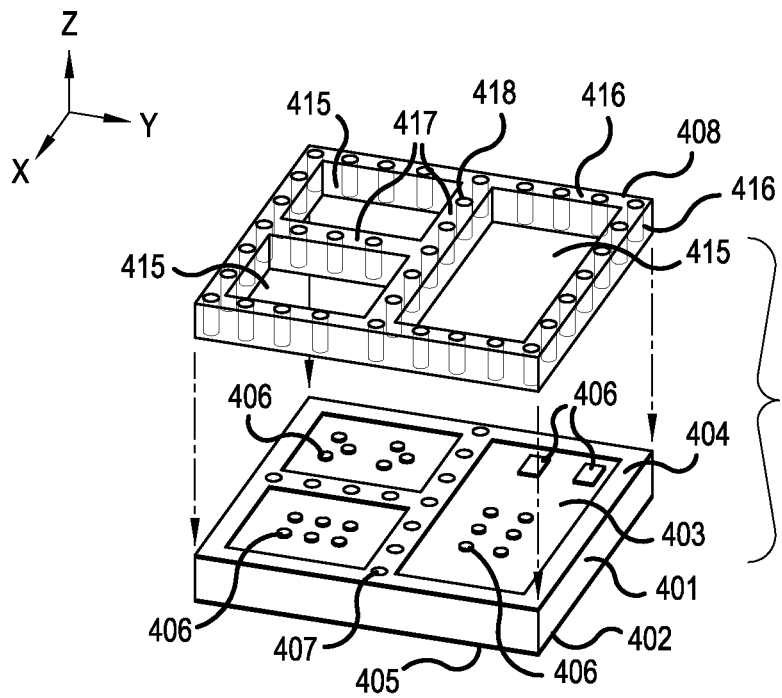
FIGS. 4A-4E show perspective views of a package structure in various stages of assembly in accordance with a representative embodiment.

Referring to FIG. 4A, a substrate 401 has a lower surface 402 and an upper surface 403, which opposes the lower surface 402. As described more fully below, in a representative embodiment, the substrate 401 is a printed circuit board (PCB) and may comprise a plurality of layers (see FIG. 4F) with or without metallization (not shown). The substrate 401 generally comprises vias (see FIG. 4F) and electrical traces (sometimes referred to as routing layers). As described more fully above in connection with representative embodiments, the vias may be used to effect electrical connections between some or all the plurality of layers that comprise the substrate 401, whereas the electrical traces (sometimes referred to as routing layers (not shown)) may be used to effect connections among different components, or to other package structures (not shown), or both. By way of example, the electrical traces may be used to connect one component to another component of the package structure 400, or from one component of the package structure 400 to a component of another package structure (not shown). As noted above in connection with representative embodiments, the electrical traces can function as transmission lines, delay lines, or impedance transformers, or form inductors, or capacitors, or combinations thereof.

Upper metallization 404 is disposed over the upper surface 403, and lower metallization 405 is disposed over the lower surface 402. The upper metallization 404 is illustratively copper, or gold, or a multi-layer of copper and gold, although other materials, or material combinations within the purview of one of ordinary skill in the art are contemplated depending on the application or design parameters. The upper metallization 404 may include a variety of metallization patterns used to effect various electrical connections. Just by way of example, the upper metallization 404 may comprise contact pads 406, configured to provide electrical connections to electronic components (not shown in FIG. 4A). Similarly, the lower metallization 405 is typically patterned to enable various electrical connections, such as noted above in connection with representative embodiments, and to provide module pins (not shown). The upper metallization 404 and lower metallization 405 each comprise a known electrically conductive material provided by a known technique, to a desired height (z-direction in the coordinate system shown).

One or more substrate vias 407 are disposed selectively beneath the upper metallization 404, and extend from the upper surface 403, through the substrate 401 to metallization (e.g., routing layers—not shown) in intermediate layers (see FIG. 4F) of the substrate 401, or to the lower surface 402. The substrate vias 407 generally provide electrical connections between the upper metallization 404 and at least a metallization (not shown) in intermediate layers, and/or the lower metallization 405. The lower metallization 405 may comprise a number of parts or portions, with these parts making electrical connections (e.g., signal, power and ground connections) as needed. In one representative embodiment, parts of the lower metallization 405 may be electrically connected to a reference ground, enabling a connection to ground by selectively providing substrate vias 407 between the upper metallization 404 and the lower metallization 405. As depicted in FIG. 4A, a frame element 408, which in the presently described representative embodiment is previously fabricated, is lowered over the upper surface 403 of the substrate 401, and can make contact to the upper surface of the upper metallization 404. Like frame elements 108, 208, 308 the frame element 408 provides structural rigidity not only after the package structure 400 is complete, but also during its fabrication and assembly. As such, once disposed over the upper surface of the substrate 401, the frame element 408 provides structural support during subsequent assembly and fabrication steps to realize the package structure 400 as depicted in FIG. 4E.

Generally, at least partial contact is made to the upper surface 403 of the substrate 401, and not completely to the upper surface of the upper metallization 404 to avoid possible delamination that can occur if contact is only made to the upper surface of the upper metallization 404. The frame element 408 comprises an outer wall 416 defining its perimeter, and a plurality of compartments 415 with respective interior walls 417 separating one compartment 415 from another. The frame element 408 also comprises a plurality of frame vias 418 disposed in the outer wall 416, or the interior walls 417, or both. In certain representative embodiments of the present teachings, such as depicted in FIGS. 4A-4D, the frame vias 418 are optionally disposed along the entire outer wall 416 (i.e., the perimeter of the frame element 408), or entirely along one or more of the interior walls 417, or both. The frame vias 418 comprise an electrically conductive material, and, as described more fully below, provide a connection to a reference ground through the substrate vias 407.

As described more fully below, additional structural rigidity is realized by the addition of the compartments 415 and interior walls 417 therebetween. Moreover, and as described more fully below, the additional electromagnetic shielding can be realized by the addition of the compartments 415 and interior walls 417 with frame vias 418. Notably, however, in the representative embodiments described in connection with FIGS. 4A-4F, the frame element 408 comprising compartments 415 is not essential. Rather, a frame that does not comprise compartments (e.g., frame element 108 described above) may be used. Beneficially, as described below, an overall reduction in height (z-direction in the coordinate system of FIGS. 4A-4F) is realized using either a frame element with compartments (e.g., frame element 408) or a frame element without compartments (e.g., frame element 108).

Figure 4B:
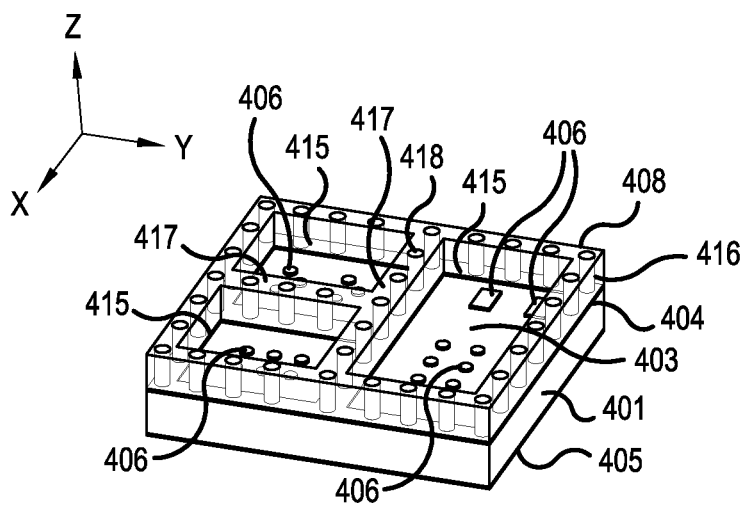

Referring to FIG. 4B, the frame element 408 is disposed over the upper surface 403, and can make contact to the upper surface of the upper metallization 404. Generally, at least partial contact s made to the upper surface 403 of the substrate 401, and not completely to the upper surface of the upper metallization 404 to avoid possible delamination that can occur if contact is only made to the upper surface of the upper metallization 404. In a representative embodiment, the frame element 408 is disposed along a perimeter of the upper surface 403, and the interior walls 417 are generally aligned with and disposed over the upper metallization 404. Furthermore, and as shown in FIG. 4F, the frame vias 418 are aligned to be electrically in contact with substrate vias 407. The frame element 408 is affixed to the upper surface 403 using a suitable adhesive, such as a known epoxy material suitable for use in electronic applications.

The frame element 408 may comprise a dielectric material (e.g., an organic or inorganic dielectric material) with the frame vias 418 disposed therein. The frame vias 418 are formed in the frame element 408 by methods that generally depend on the material used for the frame element 408. For example, if the frame element 408 comprises a negative photoresist material (e.g., commercially available SU 8), comparatively high aspect ratio openings (not shown) can be made using a known lithography methods. After the openings are formed, a known screen printing method, for example, may be used to fill the openings with a suitable electrically conductive material (e.g., copper or gold) to form the frame vias 418. Alternatively, if the frame element 408 comprises a common material used for PCBs (e.g., FR4 or other materials used for the layers of the substrate 401 as described in the incorporated patents and patent applications), openings are formed in the frame element using suitable methods such as laser drilling, punching, or the like. After the openings are formed, a known methods, such as screen-printing, are used to fill the openings with a suitable electrically conductive material (e.g., copper or gold) to form the frame vias 418. These methods and materials are merely illustrative, and other methods to form the frame vias 418 within the purview of one of ordinary skill in the art are contemplated by the present teachings.

Figure 4C:
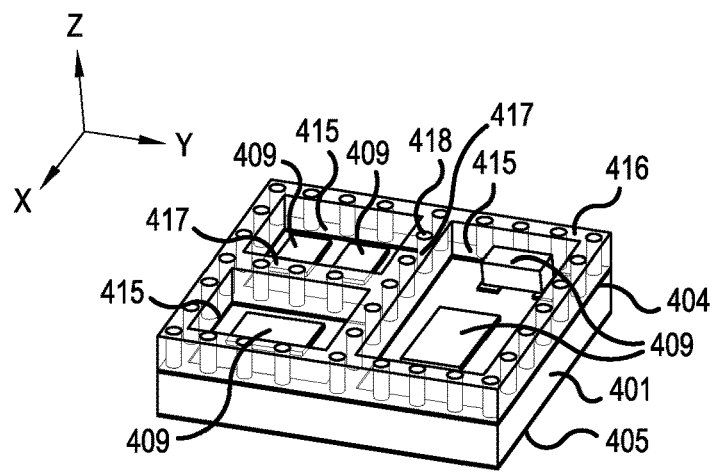

Referring to FIG. 4C, electronic components 409 are provided over the upper surface 403 in respective compartments 415 as shown. The electronic components are in electrical contact with upper metallization 404 (e.g., respective contact pads 406) in order to effect electrical connections between the various electronic components 409, between the electronic components 409 of the package structure 400, and between other components of the electronic device (not shown), in which the package structure 400 is disposed, and the electronic components 409 of the package structure 400.

The electronic components 409 are determined by the particular application of the package structure 400, and thus are generally not limited in scope by the present teachings. Generally, the electronic components 409 may be passive electrical components, or active electronic components, or both, such as those described above in connection with representative embodiments, and may be, but are not necessarily, surface mount devices (SMDs).

The various electrical connections between the electronic components 409, and between the electronic components 409 and other components of the electronic device (not shown), may be made, for example, through electronic traces provided in the substrate 401, which as described below, may comprise a plurality of layers.

As alluded to above, in certain representative embodiments electromagnetic shielding is provided by the interior walls 417 and between electronic components 409 in different compartments 415. As will be appreciated, the number and size of the compartments 415 may be dictated by the need to place electronic components in different compartments in order to provide this desired electromagnetic shielding.

In accordance with a representative embodiment, electromagnetic shielding between electronic components 409 disposed in different compartments 415 is provided by connecting the frame vias 418 selectively disposed in the outer wall 416, or the interior walls 417, or both, to reference ground. By way of example, and as depicted more clearly in FIG. 4F, the frame vias 418 can be connected to substrate vias 407, which are in turn connected to the lower metallization 405, which is in turn, connected to the reference ground. The interior walls 417, as applicable, are in contact with upper metallization 404, and are therefore, through the frame vias 418 and substrate vias 407, electrically connected to reference ground, thereby presenting reference ground voltage and typically improved electromagnetic shielding between the compartments 415, and the respective electronic components 409 thereof. Similarly, electromagnetic shielding of the electronic components 409 as well as other components of the package structure 400 (e.g., electrical traces) from signals outside the package structure 400 is also realized because the outer wall 416 is connected to reference ground.

More generally, beneficial electromagnetic shielding of the electronic components 409 (and passive electrical elements as noted above in connection with representative embodiments) in the compartments 415 is improved by providing an electrical connection between the metal layer 413, the frame vias 418, and the lower metallization 405 to form a closed connection through which mirror currents can flow. Such an arrangement reduces magnetic field penetration into the compartments 415.

The electromagnetic shielding is enhanced when the frame vias 418 are separated from each other by a distance that is significantly smaller than the wavelength of the electromagnetic radiation desirably shielded, and form a "via wall" which provides the electromagnetic shielding. In other words, the frame vias 418 so-spaced foster electromagnetic shielding electronic components 409 (and passive electrical elements as noted above in connection with representative embodiments) disposed in different compartments 415 (by vias in interior wall). As depicted in FIG. 4C, the electronic components 409 each have a height (z-direction in the coordinate system depicted), which is not necessarily the same. In fact, one (or more) of the electronic components 409 has a first height that is a maximum electronic component height. Similarly, the outer wall 416 and the interior walls 417 between the compartments 415 have a second height (z-direction), which is substantially the same. In accordance with a representative embodiment, the second height is greater than the first height. As described more fully below, the frame element 408 functions as a stop during a sequence used to remove encapsulation material (see FIG. 4D) and ultimately allows for further reduction in the thickness (z-direction) of the package structure 400 compared to certain package structures of the representative embodiments of FIGS. 1A-2F.

It is noted that it is not essential for the height of the outer wall 416 and the interior walls 417 of the frame element 408 to be greater than the maximum component height in the presently described embodiments. Rather, in accordance with a representative embodiment, like the embodiments described above in connection with representative embodiments of FIGS. 1A-2F, the height of the outer wall 416 and the interior walls 417 may be less than the maximum component height.

Because the frame element 408 is adhered to the substrate 401, additional structural rigidity is realized without increasing the overall height of the substrate 401, and the package structure 400. Furthermore, the addition of compartments 415, and the interior walls 417 therebetween, provides somewhat of a lattice arrangement, and, thereby, provides additional structural rigidity to the frame element 408 compared to frame element 108. Moreover, in the interior walls 417 and outer wall 416 in which they are disposed, the frame vias 418 serve to reinforce the interior walls 417 and outer wall 416. As such, and regardless of the shear modulus of the frame element 408, by adding the frame element 408 comprising compartments 415 and interior walls 417, and the frame vias 418 therein, structural rigidity is added to the substrate 401. Among other advantages, this additional structural rigidity provided to the substrate 401, and thus the overall package structure 400 by the frame element 408 comprising compartments 415 and interior walls 417 (with or without frame vias 418), reduces the tendency of the substrate 401 to warp in general, and over time as a result of changes in temperature. Accordingly, because of the additional structural support provided by the frame element 408, the overall thickness of the substrate 401 can be substantially the same as a known package structure without the frame element, while the mechanical stability of the substrate 401 can be improved; or the overall thickness of the substrate 401 can be reduced, and the mechanical stability of the substrate 401 can remain substantially unchanged compared to a known package structure that does not include the frame element. This reduction in overall thickness in the encapsulating material 410 provides latitude in designing the package structure 400. For example, the substrate 401 may comprise more layers, or thicker layers, or both, while maintaining the overall height of the package structure 400 the same or less than known package structures, and even package structures of certain representative embodiments discussed above, for example. The reduction in the thickness of the encapsulating material 410 also fosters a higher package density by allowing additional substrate layers to be included while maintaining the overall height of the package structure 400 compared to a structure that does not enjoy a reduction in the thickness of the encapsulating material thereof.

Figure 4D:
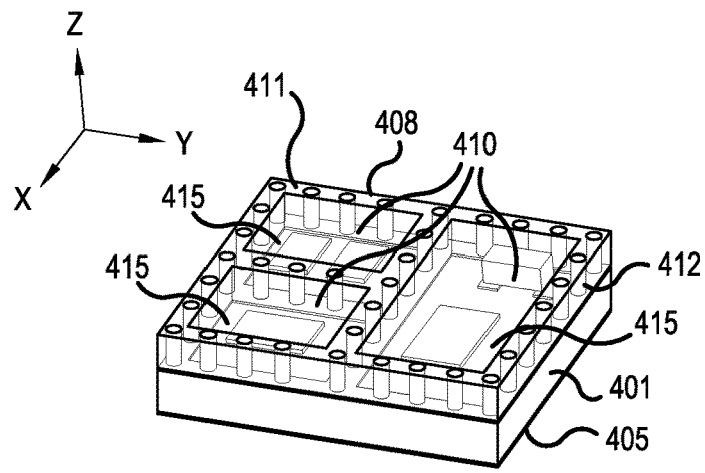
Figure 4E:
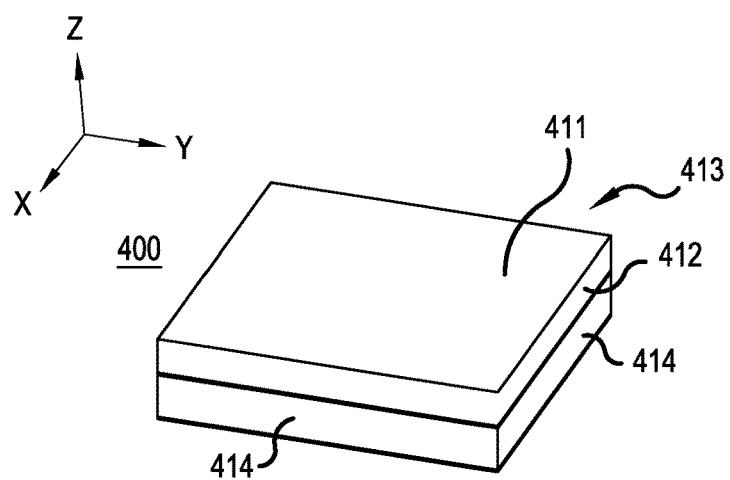
Figure 4F:
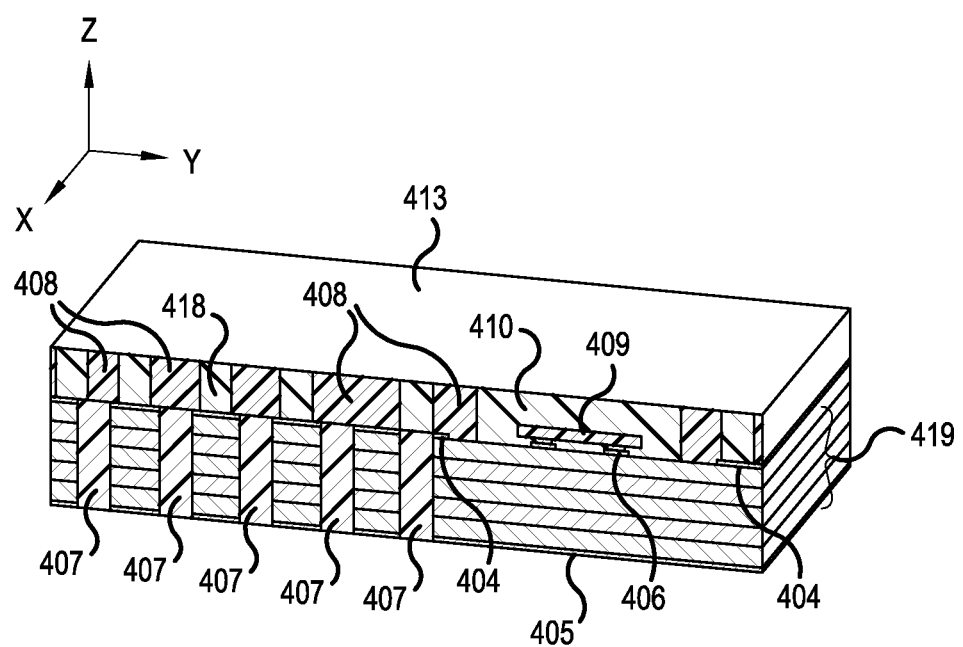
FIG. 4F shows a partial cross-sectional view of the package structure of FIG. 4E.

Referring to FIG. 4D, an encapsulating material 410 is disposed over the upper surface 403, the frame element 408, and the electronic components 409. The encapsulating material 410 comprises an upper surface 411 and sides 412. Generally, the encapsulating material 410 is a known electrically insulating material. In certain representative embodiments, the encapsulating material 410 is a so-called mold compound applied by a known method in a comparatively high pressure environment, as is known to one of ordinary skill in the art. In other representative embodiments, the encapsulating material 410 is a so-called glob-top material that is illustratively applied as a fluid using a stencil print to ensure the fluid is provided only over desired locations (e.g., in compartments 415). The glob-top is then cured, such as by application of ultra-violet light, as is known to one of ordinary skill in the art.

After application of the encapsulating material 410, a sequence to reduce its thickness (z-direction) is effected, with the sequence being dictated by the material used for the encapsulating material 410. For example, if a mold compound is used for the encapsulating material 410, a known back-grinding method may be used to remove the encapsulating material 410. Beneficially, the frame element 408 functions as a grind-stop. Because the frame element 408 has a height that is greater than the electronic component 409 with the greatest height, and the grinding of the encapsulating material 410 terminates at the top of the frame element 408, no damage can occur to the electronic components 409.

As can be appreciated, by reducing the overall thickness (z-direction) of the encapsulating material 410 to be substantially the same as the height (z-direction) of the frame element 408, the overall height of the package structure 400 is substantially reduced compared to certain package structures of representative embodiments discussed above, for example. This reduction in overall thickness in the encapsulating material provides latitude in designing the package structure 400. For example, the substrate 401 may comprise more layers, or thicker layers, or both, while maintaining the overall height of the package structure 400 the same or less than known package structures, and even package structures of certain representative embodiments discussed above, for example. The reduction in the thickness of the encapsulating material 410 also fosters a higher package density by allowing additional substrate layers to be included while maintaining the overall height of the package structure 400 compared to a structure that does not enjoy a reduction in the thickness of the encapsulating material thereof.

Referring to FIG. 4E, a metal layer 413 is disposed over the encapsulating material 410 and substantially covers the upper surface 411, and optionally the sides 412, and sides 414 of the substrate 401. In certain embodiments, the metal layer 413 can make electrical connection to a reference ground, thereby providing typically improved electromagnetic shielding to the package structure 400, and the components thereof. Alternatively, without such a connection to a reference ground, the metal layer 413 can provide electromagnetic shielding to the package structure 400, and the components thereof. Specifically, like the metal layer 113 of representative embodiments described in connections with FIGS. 1A-1F, the metal layer 413 can make electrical connection to a reference ground, thereby providing typically improved electromagnetic shielding to the package structure 400, and the components thereof, by allowing mirror currents to extend to the ground plane on the lower surface 402, or the underlying motherboard. As such, the connection to the reference ground enhances electromagnetic shielding by allowing these mirror currents to flow to the ground plane or underlying motherboard. Alternatively, without such a connection to a reference ground, the metal layer 413 can provide electromagnetic shielding to the package structure 400, and the components thereof, through induced, albeit less extensive, mirror currents, as noted above in the description of representative embodiments of FIGS. 1A-1F.

Illustratively, the metal layer 413 may be sputter-deposited copper, or gold, or a multi-layer of copper and gold, although other materials, or material combinations within the purview of one of ordinary skill in the art are contemplated depending on the application or design parameters. The metal layer 413 provides of electromagnetic shielding of the package structure 400 and the electronic components 409 thereof. As described more fully below, this electromagnetic shielding can be improved by ensuring electrical connection of the metal layer 413 to a reference ground.

FIG. 4F shows a partial cross-sectional view of the package structure 400 of FIG. 4E. As alluded to above, the substrate 401 comprises a plurality of layers 419, with the some of the substrate vias 407 extending through the plurality of layers 419 in this representative embodiment, and the frame vias 418 making electrical contact to the upper metallization 404 and to the metal layer 413, or the substrate vias 407, or both. Notably, the substrate 401 generally comprises electrical traces (not shown) configured to enable electrical connections between the various electronic components 409 of the package structure, and between other components of the electronic device (not shown), in which the package structure 400 is disposed. Electrical connections between the electrical traces and the electronic components 409, and/or between the electronic components 409 and other components of the electronic device (not shown), in which the package structure 400 is disposed may be effected using other vias (not shown).

As depicted in FIG. 4F, electronic component 409 is disposed in compartment 415, which is separated by interior wall 417 from another compartment (not shown in FIG. 4F). Moreover, and as noted above in connection with representative embodiments, frame vias 418 are electrically in contact with some of the substrate vias 407, which in turn, extend between the upper metallization 404 over which interior wall 417 is disposed, and lower metallization 405. In this case, if the lower metallization 405 is connected to reference ground, through the frame vias 418, and the frame vias 418 are in electrical contact with the metal layer 413 to form a closed electrical connection through which mirror currents can flow the interior wall 417 provides improved electromagnetic shielding.

FIGS. 5A-5F show perspective views of a package structure 500 (see FIG. 5F) in various stages of assembly in accordance with a representative embodiment. Notably, the package structure 500 may be referred to as an apparatus, and shares many common aspects, features, benefits, and applications with the package structures 100, 200, 300, 400 described above. Many of these common aspects, features, benefits, and applications may not be repeated in order to avoid obscuring the presently described representative embodiments.

Figure 5A:
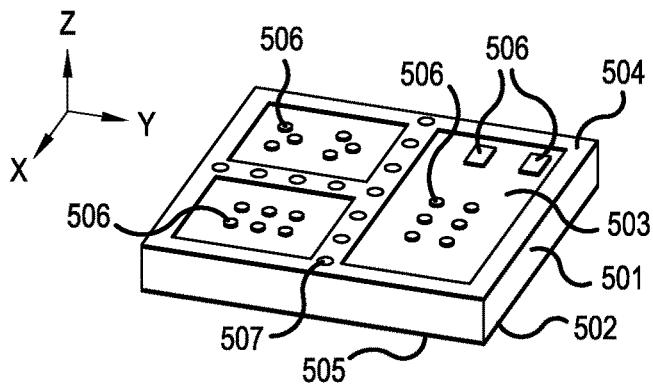
FIGS. 5A-5F show perspective views of a package structure in various stages of assembly in accordance with a representative embodiment.

Referring to FIG. 5A, a substrate 501 has a lower surface 502 and an upper surface 503, which opposes the lower surface 502. As described more fully below, in a representative embodiment, the substrate 501 is a printed circuit board (PCB) and may comprise a plurality of layers, such as described above in connection with other representative embodiments (e.g., see FIG. 4F) with or without metallization (not shown). Like substrates of other representative embodiments described above, for example, the substrate 501 generally comprises vias (not shown) and electrical traces (sometimes referred to as routing layers). The vias may be used to effect electrical connections between some or all of the plurality of layers that comprise the substrate 501, whereas the electrical traces (sometimes referred to as routing layers (not shown)) may be used to effect connections among different components, or to other package structures (not shown), or both. By way of example, the electrical traces may be used to connect one component to another component of the package structure 500, or from one component of the package structure 500 to a component of another package structure (not shown). As noted above in connection with representative embodiments, the electrical traces can function as transmission lines, delay lines, or impedance transformers, or form inductors, or capacitors, or combinations thereof.

Upper metallization 504 is disposed over the upper surface 503, and lower metallization 505 is disposed over the lower surface 502. The upper metallization 504 is illustratively copper, or gold, or a multi-layer of copper and gold, although other materials, or material combinations within the purview of one of ordinary skill in the art are contemplated depending on the application or design parameters. The upper metallization 504 may include a variety of metallization patterns used to effect various electrical connections. Just by way of example, the upper metallization 504 may comprise contact pads 506, configured to provide electrical connections to electronic components (not shown in FIG. 5A). Similarly, the lower metallization 505 is typically patterned to enable various electrical connections, such as noted above in connection with representative embodiments, and to provide module pins (not shown). The upper metallization 504 and lower metallization 505 each comprise a known electrically conductive material provided by a known technique, to a desired height (z-direction in the coordinate system shown).

One or more electrically conductive substrate vias ("substrate vias") 507 are disposed selectively beneath the upper metallization 504, and extend from the upper surface 503, through the substrate 501 to internally located metallization (not shown) or to the lower surface 502. The substrate vias 507 generally provide electrical connections between the upper metallization 504 and at least an internally located metallization (not shown) and/or the lower metallization 505. In one representative embodiment, and like in other representative embodiments described above, a portion of the lower metallization 505 is electrically connected to a reference ground, enabling a connection to ground by selectively connecting at least some of the substrate vias 507 between the upper metallization 504 and the lower metallization 505.

Figure 5B:
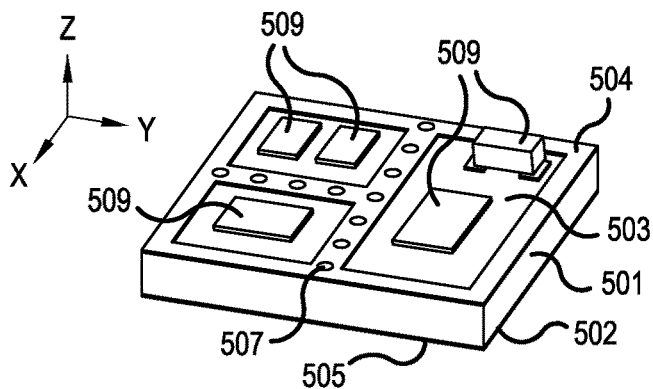

Referring to FIG. 5B, electronic components 509 are provided over the upper surface 503 as shown. The electronic components are in electrical contact with upper metallization 504 (e.g., respective contact pads 506) in order to effect electrical connections between the various electronic components 509 and between the electronic components 509 of the package structure 500, and between other components of the electronic device (not shown), in which the package structure 500 is disposed, and the electronic components 509 of the package structure 500.

The electronic components 509 are determined by the particular application of the package structure 500, and thus are generally not limited in scope by the present teachings. Generally, the electronic components 509 may be passive electrical components, or active electronic components, or both, such as those described above, and may be, but are not necessarily, surface mount devices (SMDs).

The various electrical connections between the electronic components 509, and between the electronic components 509 and other components of the electronic device (not shown), may be made, for example, through electronic traces provided in the substrate 501, which as described below, may comprise a plurality of layers.

Figure 5C:
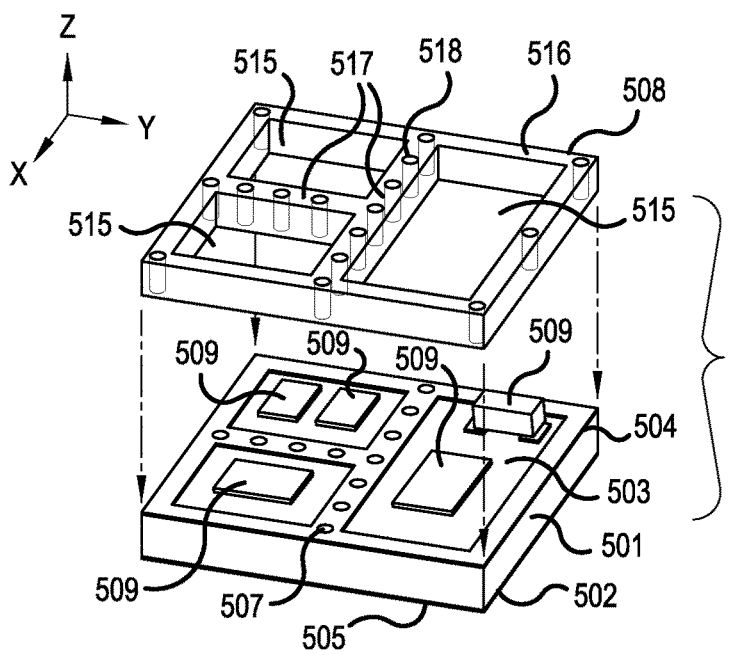

As depicted in FIG. 5C, a frame element 508 is lowered over the upper surface 503 of the substrate 501, and can make contact to the upper surface of the upper metallization 504. Like frame elements 108, 208, 308 and 408, the frame element 508 provides structural rigidity not only after the package structure 300 is complete, but also during its fabrication and assembly. As such, once disposed over the upper surface of the substrate 501, the frame element 508 provides structural support during subsequent assembly and fabrication steps to realize the package structure 500 as depicted in FIG. 5E.

Generally, at least partial contact is made to the upper surface 503 of the substrate 501, and not completely to the upper surface of the upper metallization 504 to avoid possible delamination that can occur if contact is only made to the upper surface of the upper metallization 504. The frame element 508 comprises an outer wall 516 defining its perimeter, and a plurality of compartments 515 with respective interior walls 517 separating one compartment 515 from another. The frame element 508 also comprises a plurality of frame vias 518 disposed in the outer wall 516, or the interior walls 517, or both. The frame vias 518 comprise an electrically conductive material, and, as described more fully below, provide a connection to a reference ground through the substrate vias 507.

The frame element 508 may comprise a dielectric material (e.g., an organic or inorganic dielectric material) with the frame vias 518 disposed therein. The frame vias 518 are formed in the frame element 508 by methods that generally depend on the material used for the frame element 508. The frame element 508 comprising frame vias 518 may comprise materials, and be fabricated by methods, as described above in connection with representative embodiments of FIG. 4B. In certain embodiments in which the frame element 508 comprises metal, the frame vias 518 can be, but are not necessarily, foregone.

The electronic components 509 are determined by the particular application of the package structure 500, and thus are generally not limited in scope by the present teachings. Generally, the electronic components 509 may be passive electrical components, or active electronic components, or both, such as those described above in connection with representative embodiments, and may be, but are not necessarily, surface mount devices (SMDs).

As alluded to above, in certain representative embodiments electromagnetic shielding is provided by the interior walls 517 and between electronic components 509 in different compartments 515. As will be appreciated, the number and size of the compartments 515 may be dictated by the need to place electronic components in different compartments in order to provide this desired electromagnetic shielding.

In accordance with a representative embodiment, and as described above in connection with the representative embodiments of FIGS. 4A-4F, typically improved electromagnetic shielding between electronic components 509 disposed in different compartments 515 is provided by connecting the frame vias 518 selectively disposed in the outer wall 516, or the interior walls 517, or both, to reference ground. Like substrates of other representative embodiments described above, for example, the substrate 501 comprises substrate vias (not shown in FIGS. 5A-5E). By way of example, and as described more fully in connection with in FIG. 5E, the frame vias 518 can be electrically connected to substrate vias, which are in turn electrically connected to the a portion of the lower metallization 505, which is electrically connected to the reference ground. Through the frame vias 518, the outer wall 516 and interior walls 517, as applicable, are electrically in contact with upper metallization 504, and are therefore electrically connected to reference ground, thereby presenting reference ground voltage and typically improved electromagnetic shielding between the compartments 515, and the respective electronic components 509 thereof. Similarly, electromagnetic shielding of the electronic components 509 as well as other components of the package structure 500 (e.g., electrical traces) from signals outside the package structure 500 is also realized because the outer wall 516 is connected to reference ground. More generally, beneficial electromagnetic shielding of the electronic components 509 (and passive electrical elements as noted above in connection with representative embodiments) in the compartments 515 is improved by providing an electrical connection between the metal layer 513, the frame vias 518, and the lower metallization 505 to form a closed connection through which mirror currents can flow. Such an arrangement reduces magnetic field penetration into the compartments 515.

The electromagnetic shielding is enhanced when the frame vias 518 are electrically connected to reference ground and therefore, when separated by a specified distance from each other form a "via wall" which provides electromagnetic shielding. Stated somewhat differently, the frame vias 518 foster electromagnetic shielding electronic components 509 (and passive electrical elements as noted above) disposed in different compartments 515 (by vias in interior wall). Moreover, the frame vias 518 along the perimeter of the frame element 508 aid in suppressing electromagnetic interaction between the package structure 500 and "outside" signals (e.g., ambient signals or signals from nearby electronics).

As depicted in FIG. 5C, the electronic components 509 each have a height (z-direction in the coordinate system depicted), which is not necessarily the same. In fact, one (or more) of the electronic components 509 has a first height that is a maximum electronic component height. Similarly, the outer wall 516 and the interior walls 517 between the compartments 515 have a second height (z-direction), which is substantially the same. In accordance with a representative embodiment, the second height is greater than the first height. As described more fully below, the frame element 508 functions as a stop during a sequence used to remove encapsulation material (see FIG. 5E) and ultimately allows for further reduction in the thickness (z-direction) of the package structure 500 compared to known structures, or even structures of other representative embodiments, such as those discussed above in connection with representative embodiments of FIGS. 1A-2F.

It is noted that it is not essential for the height of the outer wall 516 and the interior walls 517 of the frame element 508 to be greater than the maximum component height in the presently described embodiments. Rather, in accordance with a representative embodiment, like the embodiments described above in connection with representative embodiments of FIGS. 1A-2F, the height of the outer wall 516 and the interior walls 517 may be less than the maximum component height.

Because the frame element 508 is adhered to the substrate 501, additional structural rigidity is realized without increasing the overall height of the substrate 501, and the package structure 500. Furthermore, the addition of compartments 515, and the interior walls 517 therebetween, provides somewhat of a lattice arrangement, and, thereby, provides additional structural rigidity to the frame element 508 compared to frame element 108. Moreover, in the interior walls 517 and outer wall 516 in which they are disposed, the frame vias 518 serve to reinforce the interior walls 517 and outer wall 516. As such, and regardless of the shear modulus of the frame element 508, by adding the frame element 508 comprising compartments 515 and interior walls 517, and the frame vias 518 therein, structural rigidity is added to the substrate 501. Among other advantages, this additional structural rigidity provided to the substrate 501, and thus the overall package structure 500 by the frame element 508 comprising compartments 515 and interior walls 517 (with or without frame vias 518), reduces the tendency of the substrate 501 to warp in general and over time as a result of changes in temperature. Accordingly, because of the additional structural support provided by the frame element 508, the overall thickness of the substrate 501 can be substantially the same as a known package structure without the frame element, while the mechanical stability of the substrate 501 can be improved; or the overall thickness of the substrate 501 can be reduced, and the mechanical stability of the substrate 501 can remain substantially unchanged. This reduction in overall thickness in the encapsulating material 410 provides latitude in designing the package structure 400. For example, the substrate 401 may comprise more layers, or thicker layers, or both, while maintaining the overall height of the package structure 400 the same or less than known package structures, and even package structures of certain representative embodiments discussed above, for example. The reduction in the thickness of the encapsulating material 410 also fosters a higher package density by allowing additional substrate layers to be included while maintaining the overall height of the package structure 400 compared to a structure that does not enjoy a reduction in the thickness of the encapsulating material thereof.

Figure 5D:
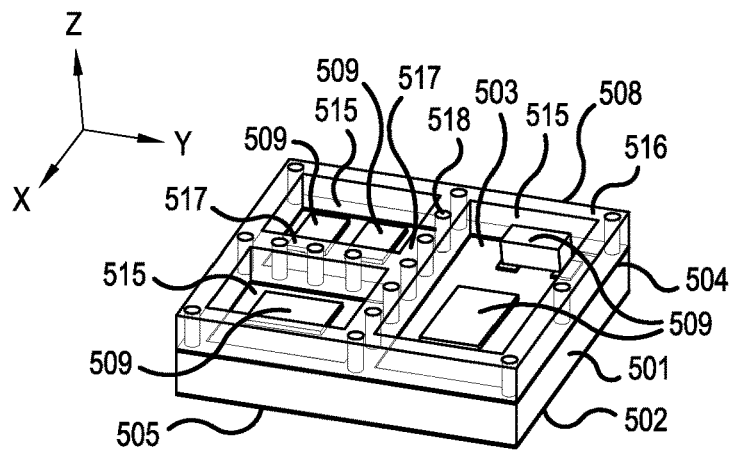
Figure 5E:
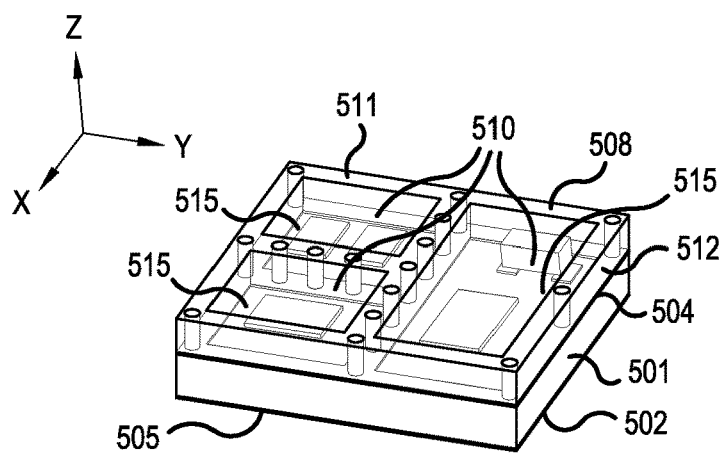
Figure 5F:
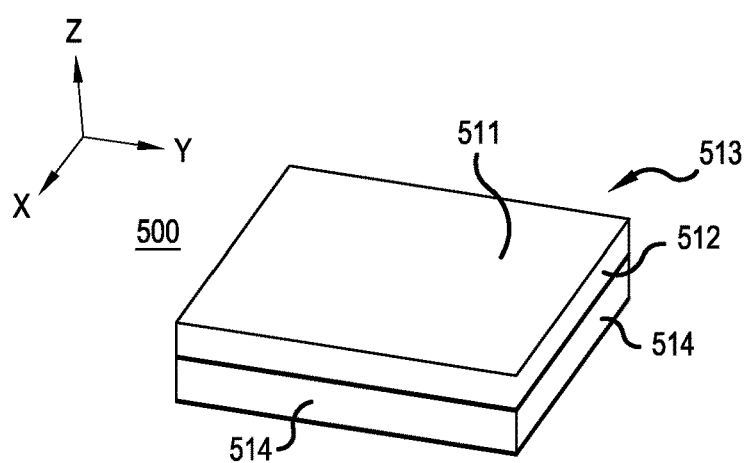

Referring to FIG. 5D, an encapsulating material 510 is disposed over the upper surface 503, the frame element 508, and the electronic components 509. The encapsulating material 510 comprises a top surface 511 and sides 512. Generally, the encapsulating material 510 is a known electrically insulating material. In certain representative embodiments, the encapsulating material 510 is a so-called mold compound applied by a known method in a comparatively high pressure environment, as is known to one of ordinary skill in the art. In other representative embodiments, the encapsulating material 510 is a so-called glob-top material that is illustratively applied as a fluid using a stencil print to ensure the fluid is provided only over desired locations (e.g., in compartments 515). The glob-top is then cured, such as by application of ultra-violet light, as is known to one of ordinary skill in the art.

Referring to FIG. 5E, a metal layer 513 is disposed over the encapsulating material 510 and substantially covers the top surface 511, and optionally the sides 512, and sides 514 of the substrate 501. In certain embodiments, the metal layer 513 can make electrical connection to a reference ground, thereby providing typically improved electromagnetic shielding to the package structure 500, and the components thereof. Alternatively, without such a connection to a reference ground, the metal layer 513 can provide electromagnetic shielding to the package structure 500, and the components thereof. Specifically, like the metal layer 113 of representative embodiments described in connections with FIGS. 1A-1F, the metal layer 513 can make electrical connection to a reference ground, thereby providing typically improved electromagnetic shielding to the package structure 500, and the components thereof, by allowing mirror currents to extend to the ground plane on the lower surface 502, or the underlying motherboard. As such, the connection to the reference ground enhances electromagnetic shielding by allowing these mirror currents to flow to the ground plane or underlying motherboard. Alternatively, without such a connection to a reference ground, the metal layer 513 can provide electromagnetic shielding to the package structure 500, and the components thereof, through induced, albeit less extensive, mirror currents, as noted above in the description of representative embodiments of FIGS. 1A-1F.

Illustratively, the metal layer 513 may be sputter-deposited gold, or similar metal, or metal alloy. The metal layer 513 provides of electromagnetic shielding of the package structure 500 and the electronic components 509 thereof. As described more fully above, this electromagnetic shielding can be improved by ensuring electrical connection of the metal layer 513 to a reference ground.

FIGS. 6A-6F show perspective views of a package structure 600 (see FIG. 6F) in various stages of assembly in accordance with a representative embodiment. Notably, the package structure 600 may be referred to as an apparatus, and shares many common aspects, features, benefits, and applications with the package structures 100, 200, 300, 400 and 500 described above. Many of these common aspects, features, benefits, and applications may not be repeated in order to avoid obscuring the presently described representative embodiments.

Figure 6A:
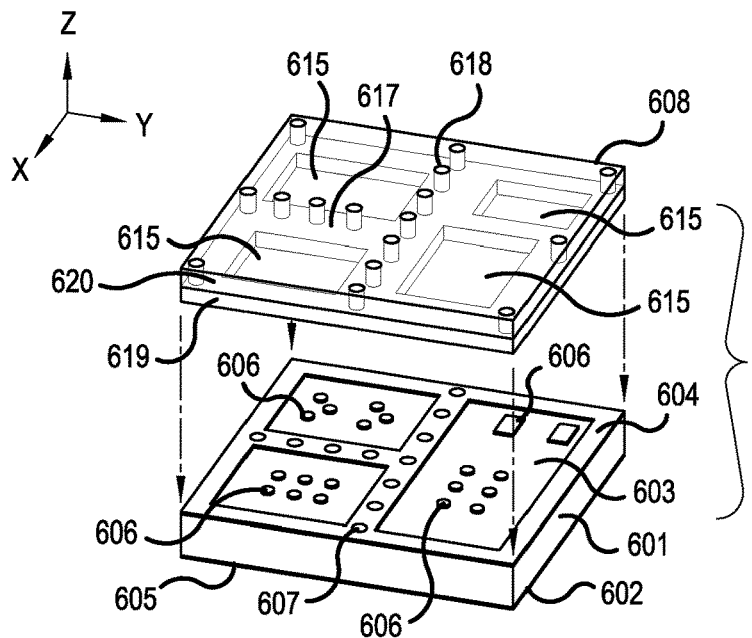
FIGS. 6A-6F show perspective views of a package structure in various stages of assembly in accordance with a representative embodiment.

Referring to FIG. 6A, a substrate 601 has a lower surface 602 and an upper surface 603, which opposes the lower surface 602. As described more fully below, in a representative embodiment, the substrate 601 is a printed circuit board (PCB) and may comprise a plurality of layers. As described above in connection with other representative embodiments, the substrate 601 generally comprises vias (not shown) and electrical traces (sometimes referred to as routing layers (not shown)). The vias may be used to effect electrical connections between some or all the plurality of layers that comprise the substrate 601, whereas the electrical traces (sometimes referred to as routing layers (not shown)) may be used to effect connections among different components, or to other package structures (not shown), or both. By way of example, the electrical traces may be used to connect one component to another component of the package structure 600, or from one component of the package structure 600 to a component of another package structure (not shown). The electrical traces can function as transmission lines, delay lines, or impedance transformers, or form inductors, or capacitors, or combinations thereof.

Upper metallization 604 is disposed over the upper surface 603, and lower metallization 605 is disposed over the lower surface 602. The upper metallization 604 is illustratively copper, or gold, or a multi-layer of copper and gold, although other materials, or material combinations within the purview of one of ordinary skill in the art are contemplated depending on the application or design parameters. The upper metallization 604 may include a variety of metallization patterns used to effect various electrical connections. Just by way of example, the upper metallization 604 may comprise contact pads 606, configured to provide electrical connections to electronic components (not shown in FIG. 6A). Similarly, the lower metallization 605 is typically patterned to enable various electrical connections, such as noted above in connection with representative embodiments, and to provide module pins (not shown). The upper metallization 604 and lower metallization 605 each comprise a known electrically conductive material provided by a known technique, to a desired height (z-direction in the coordinate system shown).

One or more electrically substrate vias (not shown in FIGS. 6A-6E) are disposed selectively beneath the upper metallization 604, and extend from the upper surface 603, through the substrate 601 to metallization (e.g., routing layers—not shown) in intermediate layers (not shown in FIGS. 6A-6F) of the substrate 601, or to the lower surface 602. The substrate vias generally provide electrical connections between the upper metallization 604 and at least a metallization (not shown) in intermediate layers, and/or the lower metallization 605. The lower metallization 605 may comprise a number of parts or portions, with these parts making electrical connections (e.g., signal, power and ground connections) as needed. In one representative embodiment, parts of the lower metallization 605 may be electrically connected to a reference ground, enabling a connection to ground by selectively providing substrate vias (not shown) between the upper metallization 604 and the lower metallization 605.

As depicted in FIG. 6A, a frame element 608, which in the presently described representative embodiment, is previously fabricated, is lowered over the upper surface 603 of the substrate 601. The frame element 608 comprises a first layer 619, and a second layer 620, which, as described more fully below is removed. The frame element 608 also comprises an outer wall 616 defining its perimeter, and a plurality of compartments 615 with respective interior walls 617 separating one compartment 615 from another. The frame element 608 also comprises a plurality of frame vias 618 disposed in the outer wall 616, or the interior walls 617, or both. The frame vias 618 comprise an electrically conductive material, and, as described more fully below, provide an electrically connection to a reference ground through the substrate vias 607.

Like frame elements 108, 208, 308, 408 and 508, the frame element 608 provides structural rigidity not only after the package structure 600 is complete, but also during its fabrication and assembly. As such, once disposed over the upper surface of the substrate 401, the frame element 608 provides structural support during subsequent assembly and fabrication steps to realize the package structure 600 as depicted in FIG. 6E.

As described more fully below, additional structural rigidity is realized by the addition of the compartments 615 and interior walls 617 therebetween. Moreover, and as described more fully below, the additional electromagnetic shield can be realized by the addition of the compartments 615 and interior walls 617 with frame vias 618. Notably, however, in the representative embodiments described in connection with FIGS. 6A-6F, the frame element 608 comprising compartments 615 is not essential. Rather, a frame that does not comprise compartments (e.g., frame element 108 described above) may be used. Beneficially, as described below, an overall reduction in height (z-direction in the coordinate system of FIGS. 6A-6F) is realized using either a frame element with compartments (e.g., frame element 608) or a frame element without compartments (e.g., frame element 108).

Figure 6B:
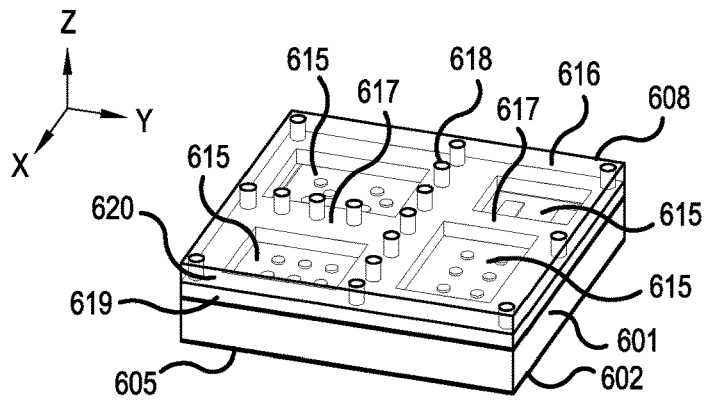

Referring to FIG. 6B, the frame element 608 is disposed over the upper surface 603, and can make contact to the upper surface of the upper metallization 604. Generally, at least partial contact is made to the upper surface 603 of the substrate 601, and not completely to the upper surface of the upper metallization 604 to avoid possible delamination that can occur if contact is only made to the upper surface of the upper metallization 604. In a representative embodiment, the frame element 608 is disposed along a perimeter of the upper surface 603, and the interior walls 617 are generally aligned with and disposed over the upper metallization 604. Furthermore, and as described above in connection with other representative embodiments above, the frame vias 618 are aligned to be electrically in contact with at some of the substrate vias, which in turn are electrically connected to reference ground. The frame element 608 is affixed to the upper surface 603 using a suitable adhesive, such as a known epoxy material suitable for use in electronic applications.

Figure 6C:
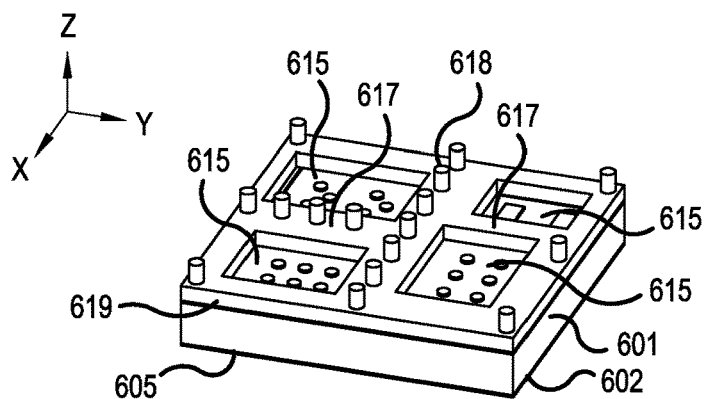

The first and second layers 619, 620 of the frame element 608 may comprise dielectric material (e.g., an organic or inorganic dielectric material) with the frame vias 618 disposed therein. The first and second layers 619, 620 could be made from the same material, or from different materials. A known dry-etching (e.g., inductively-coupled plasma etch), or a known wet etch method could be used to remove the second layer 620 of the frame element 608. Of course, only one layer could be used for the frame element 608, and a portion of it may be removed by a known dry or wet etch method. The frame vias 618 are formed in the frame element 608 by methods that generally depend on the material used for the frame element 608, such as by methods described above. Referring to FIG. 6C, the second layer 620 is removed, partially exposing the frame vias 618, which extend above the first layer 619. The frame vias 618 are formed using a known method, such as described above, by forming openings (not shown) in the first and second layers 619, 620, then filling the openings with suitable electrically conductive material. Notably, in a representative embodiment, the first layer 619 comprises an electrically conductive material (e.g., copper or aluminum), and the second layer 620 is a dielectric material (e.g., an organic material). In this embodiment, the frame vias 618 may be formed in the second layer 620 only, but contact the first layer 619. Thereafter, the second layer 620 is removed by a known method as above, and the frame element 618, which is electrically conductive, and frame vias 618 are provided.

Figure 6D:
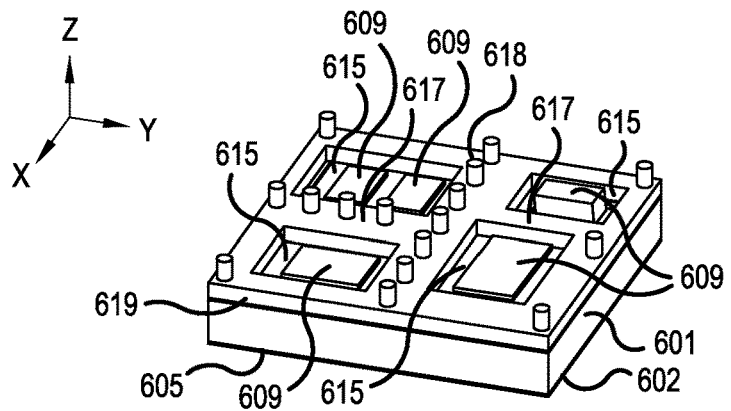
Figure 6E:
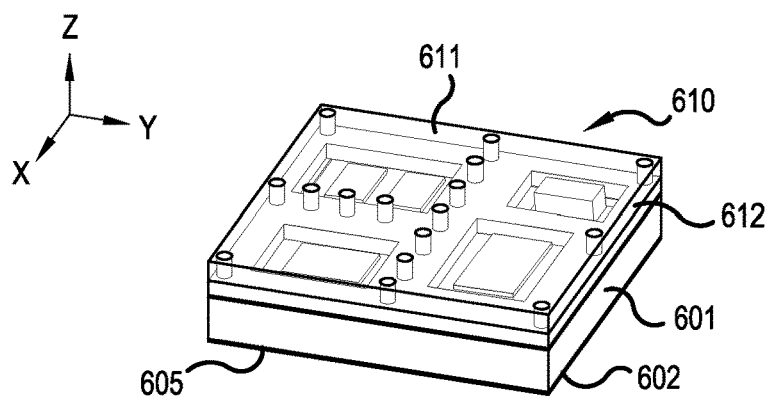

Referring to FIG. 6D, electronic components 609 are provided over the upper surface 603 in respective compartments 615 as shown. The electronic components are in electrical contact with upper metallization 604 (e.g., respective contact pads 606) in order to effect electrical connections between the various electronic components 609 and between the electronic components 609 of the package structure 600, and between other components of the electronic device (not shown), in which the package structure 600 is disposed, and the electronic components 609 of the package structure 600.

The electronic components 609 are determined by the particular application of the package structure 600, and thus are generally not limited in scope by the present teachings. Generally, the electronic components 609 may be passive electrical components, or active electronic components, or both, such as those described above, and may be, but are not necessarily, surface mount devices (SMDs).

The various electrical connections between the electronic components 609, and between the electronic components 609 and other components of the electronic device (not shown), may be made, for example, through electronic traces provided in the substrate 601, which as described below, may comprise a plurality of layers.

As in other representative embodiments described above, in certain representative embodiments electromagnetic shielding is provided by the frame vias 618 in the interior walls 617 and between electronic components 609 in different compartments 615. As will be appreciated, the number and size of the compartments 615 may be dictated by the need to place electronic components in different compartments in order to provide this desired electromagnetic shielding.

In accordance with a representative embodiment, electromagnetic shielding between electronic components 609 disposed in different compartments 615 is provided by connecting the frame vias 618 selectively disposed in the outer wall 616, or the interior walls 617, or both, to reference ground. By way of example, the frame vias 618 can be electrically connected to substrate vias 607, which are in turn electrically connected to the lower metallization 605, which is in turn, electrically connected to the reference ground.

More generally, beneficial electromagnetic shielding of the electronic components 609 (and passive electrical elements as noted above in connection with representative embodiments) in the compartments 615 is improved by providing an electrical connection between the metal layer 613 (see FIG. 6E), the frame vias 618, and the lower metallization 605 to form a closed connection through which mirror currents can flow. Such an arrangement reduces magnetic field penetration into the compartments 615.

The electromagnetic shielding is enhanced when the frame vias 618 are electrically connected to reference ground and therefore, when separated by a specified distance from each other form a "via wall" which provides electromagnetic shielding. Or with other words the frame vias 618 foster electromagnetic shielding electronic components 609 (and passive electrical elements as noted above) disposed in different compartments 615 (by vias in interior wall). Moreover, the frame vias 618 along the perimeter of the frame 608 aid in suppressing electromagnetic interaction between the package structure 600 and "outside" signals (e.g., ambient signals or signals from nearby electronics).

As depicted in FIG. 6D, the electronic components 609 each have a height (z-direction in the coordinate system depicted), which is not necessarily the same. In fact, one (or more) of the electronic components 609 has a first height that is a maximum electronic component height. Similarly, the outer wall 616 and the interior walls 617 between the compartments 615 have a second height (z-direction), which is substantially the same. Finally, the frame vias 618 extend above the first layer 619 of the frame element 608, and have a third height, which is substantially the same.

As described more fully below, the frame vias 618 function as a stop during a sequence used to remove encapsulation material (see FIG. 6E) and ultimately allows for further reduction in the thickness (z-direction) of the package structure 600 compared to, for example, certain package structures of representative embodiments of FIGS. 1A-2F.

It is noted that it is not essential for the height of the frame vias 618 and the height of the frame 608, which is substantially same to be greater than the maximum component height in the presently described embodiments. Rather, in accordance with a representative embodiment, like the embodiments described above in connection with FIGS. 1A-2F, the height of the frame vias 618 and the height of the frame 608 may be less than the maximum component height. However, the third height (i.e., the height of the frame vias 618) is always greater than the second height (i.e., the height of the outer wall 616 and the interior walls 617 of the frame element 608).

Because the frame element 608 is adhered to the substrate 601, additional structural rigidity is realized without increasing the overall height of the substrate 601, and the package structure 600. Furthermore, the addition of compartments 615, and the interior walls 617 therebetween, provides somewhat of a lattice arrangement, and, thereby, provides additional structural rigidity to the frame element 608 compared to frame element 108. Moreover, in the interior walls 617 and outer wall 616 in which they are disposed, the frame vias 618 serve to reinforce the interior walls 617 and outer wall 616. As such, and regardless of the shear modulus of the frame element 608, by adding the frame element 608 comprising compartments 615 and interior walls 617, the frame vias 618 therein, structural rigidity is added to the substrate 601. Among other advantages, this additional structural rigidity provided to the substrate 601, and thus the overall package structure 600 by the frame element 608 comprising compartments 615 and interior walls 617 (with or without frame vias), reduces the tendency of the substrate 601 to warp in general and over time as a result of changes in temperature. Accordingly, because of the additional structural support provided by the frame element 608, the overall thickness of the substrate 601 can be substantially the same as a known package structure without the frame element, while the mechanical stability of the substrate 601 can be improved; or the overall thickness of the substrate 601 can be reduced, and the mechanical stability of the substrate 601 can remain substantially unchanged compared to a known package structure that does not include the frame element.

Referring to FIG. 6E, an encapsulating material 610 is disposed over the upper surface 603, the frame element 608, and the electronic components 609. The encapsulating material 610 comprises a top surface 611 and sides 612. Generally, the encapsulating material 610 is a known electrically insulating material. In certain representative embodiments, the encapsulating material 610 is a so-called mold compound applied by a known method in a comparatively high pressure environment, as is known to one of ordinary skill in the art. In other representative embodiments, the encapsulating material 610 is a so-called glob-top material that is illustratively applied as a fluid using a stencil print to ensure the fluid is provided only over desired locations. The glob-top is then cured, such as by application of ultra-violet light, as is known to one of ordinary skill in the art.

After application of the encapsulating material 610, a sequence to reduce its thickness (z-direction) is effected, with the sequence being dictated by the material used for the encapsulating material 610. For example, if a mold compound is used for the encapsulating material 610, a known back-grinding method may be used to remove the encapsulating material 610. Beneficially, the frame vias 618 functions as a grind-stop. Because the frame vias 618 have a height that is greater than the electronic component 609 with the greatest height, and the grinding of the encapsulating material 610 terminates at the top of the frame vias 618, no damage can occur to the electronic components 609.

As can be appreciated, by reducing the overall thickness (z-direction) of the encapsulating material 610 to be substantially the same as the height (z-direction) of the frame element 608, the overall height of the package structure 600 is substantially reduced. This reduction in overall thickness in the encapsulating material 610 provides latitude in designing the package structure 600. For example, the substrate 601 may comprise more layers, or thicker layers, or both, while maintaining the overall height of the package structure 600 the same or less than known package structures, and even package structures of certain representative embodiments discussed above, for example. The reduction in the thickness of the encapsulating material 610 also fosters a higher package density by allowing additional substrate layers to be included while maintaining the overall height of the package structure 600 compared to a structure that does not enjoy a reduction in the thickness of the encapsulating material thereof.

Figure 6F:
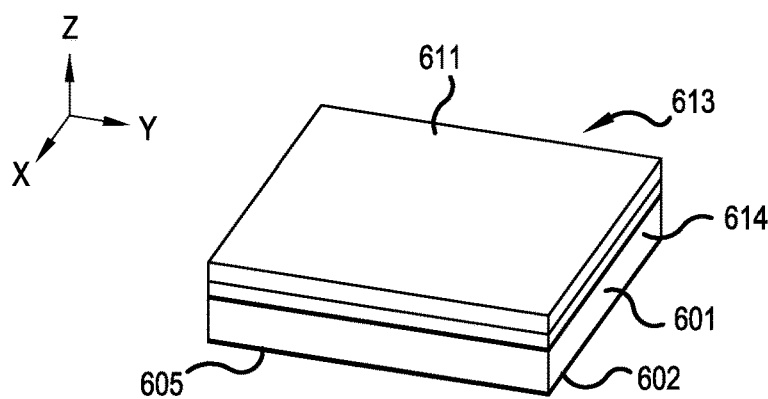

Referring to FIG. 6F, a metal layer 613 is disposed over the encapsulating material 610 and substantially covers the top surface 611, the sides 612, and sides 614 of the substrate 601. In certain embodiments, the metal layer 613 can make electrical connection to a reference ground, thereby providing typically improved electromagnetic shielding to the package structure 600, and the components thereof. Alternatively, without such a connection to a reference ground, the metal layer 613 can provide electromagnetic shielding to the package structure 600, and the components thereof. Specifically, like the metal layer 113 of representative embodiments described in connections with FIGS. 1A-1F, the metal layer 613 can make electrical connection to a reference ground, thereby providing typically improved electromagnetic shielding to the package structure 600, and the components thereof, by allowing mirror currents to extend to the ground plane on the lower surface 602, or the underlying motherboard. As such, the connection to the reference ground enhances electromagnetic shielding by allowing these mirror currents to flow to the ground plane or underlying motherboard. Alternatively, without such a connection to a reference ground, the metal layer 613 can provide electromagnetic shielding to the package structure 600, and the components thereof, through induced, albeit less extensive, mirror currents, as noted above in the description of representative embodiments of FIGS. 1A-1F.

Illustratively, the metal layer 613 may be sputter-deposited copper, or gold, or a multi-layer of copper and gold, although other materials, or material combinations within the purview of one of ordinary skill in the art are contemplated depending on the application or design parameters. The metal layer 613 provides of electromagnetic shielding of the package structure 600 and the electronic components 609 thereof. As described more fully above, this electromagnetic shielding can be improved by ensuring electrical connection of the metal layer 613 to a reference ground.

In view of this disclosure it is noted that the various semiconductor packages and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

We claim:

1. An apparatus, comprising:
   a substrate having an upper surface and a lower surface;
   an electronic component disposed over the substrate;
   an upper metallization disposed over the upper surface;
   a frame element disposed directly on the upper metallization, the frame element comprising an outer wall disposed along a perimeter of the substrate, and a plurality of compartments disposed within a perimeter of the frame element, the frame element being configured to provide structural rigidity to the apparatus;
   an encapsulating material disposed over an upper surface of the substrate, the electronic component and the frame element, the encapsulating material having upper surface and sides; and
   an electrically conductive layer disposed over the upper surface and the sides of the encapsulating material.

2. The apparatus of claim 1, wherein the electronic component is one of a plurality of electronic components, and at least one of the plurality of electronic components has a first height that is a maximum electronic component height.

3. The apparatus of claim 2, wherein the frame element has a second height that is not greater than the first height.

4. The apparatus of claim 3, wherein the encapsulating material has a thickness that is greater than the first height.

5. The apparatus of claim 1, wherein the electrically conductive layer is disposed over a sidewall of the substrate.

6. The apparatus of claim 2, wherein the frame element has a second height that is greater than the first height.

7. The apparatus of claim 6, wherein the encapsulating material has a thickness that is substantially the same as the second height.

8. The apparatus of claim 1, wherein the frame element comprises an electrically conductive material.

9. The apparatus of claim 1, wherein the frame element comprises a dielectric material.

10. The apparatus of claim 1, wherein the substrate comprises a plurality of layers.

11. The apparatus of claim 10, wherein the substrate comprises a plurality of electrically conductive vias.

12. The apparatus of claim 1, wherein each of the plurality of compartments are substantially surrounded by walls of the frame element.

13. The apparatus of claim 12, wherein the electronic component is one of a plurality of electronic components, and each of the plurality of compartments comprises at least one of the plurality of electronic components.

14. The apparatus of claim 12, wherein the electronic component is one of a plurality of electronic components, and at least one of the electronic components has a first height that is a maximum electronic component height.

15. The apparatus of claim 14, wherein the frame element has a second height that is not greater than the first height.

16. The apparatus of claim 15, wherein the encapsulating material has a thickness that is greater than the second height.

17. The apparatus of claim 1, wherein the frame element configured to provide electromagnetic shielding.

18. The apparatus of claim 14, wherein the frame element has a second height that is greater than the first height.

19. The apparatus of claim 18, wherein the encapsulating material has a thickness that is substantially the same as the second height.

20. The apparatus of claim 13, wherein the frame element comprises an electrically conductive material configured to provide electromagnetic shielding of electronic components disposed in different compartments of the frame element.

21. The apparatus of claim 12, wherein the frame element comprises a dielectric material.

22. The apparatus of claim 12, wherein the substrate comprises a plurality of layers.

23. The apparatus of claim 22, wherein the substrate comprises a plurality of electrically conductive vias.

24. The apparatus of claim 1, wherein the plurality of compartments comprise respective interior walls separating one of the plurality of compartments from another of the plurality.

25. The apparatus of claim 1, wherein the substrate has sides, and the electrically conductive layer is disposed over the sides of the substrate.

26. The apparatus of claim 1, wherein the electrically conductive layer is electrically connected to a reference ground.

27. The apparatus of claim 1, wherein the electrically conductive layer is not electrically connected to a reference ground.

28. The apparatus of claim 1, further comprising a lower metallization disposed over the lower surface of the substrate.

29. The apparatus of claim 1, wherein the upper metallization has a substantially identical shape as the frame element.

\* \* \* \* \*